United States Patent [19]
Deguchi et al.

[11] Patent Number: 5,862,021
[45] Date of Patent: Jan. 19, 1999

[54] MAGNETORESISTIVE EFFECT DEVICE UTILIZING AN OXIDE LAYER ADJACENT ONE OF THE MAGNETIC LAYERS

[75] Inventors: Haruhiko Deguchi, Tenri; Takaya Nakabayashi, Ayama-gun; Tomohisa Komoda, Naga-gun; Tohru Kira, Tenri; Noboru Fujita, Kashiba; Kazuhiro Uneyama, Sendai, all of Japan

[73] Assignee: Sharp Kabushiki Kaisha, Osaka, Japan

[21] Appl. No.: 874,790

[22] Filed: Jun. 13, 1997

[30] Foreign Application Priority Data

Jun. 17, 1996 [JP] Japan .................................. 8-155791
Jun. 17, 1996 [JP] Japan .................................. 8-155826

[51] Int. Cl.$^6$ ............................................ G11B 5/39
[52] U.S. Cl. ............................................... 360/113
[58] Field of Search ................................... 360/113

[56] References Cited

U.S. PATENT DOCUMENTS

| | | | |
|---|---|---|---|
| 5,373,238 | 12/1994 | McGuire et al. | 324/252 |
| 5,432,734 | 7/1995 | Kawano et al. | 365/158 |

FOREIGN PATENT DOCUMENTS

| | | |
|---|---|---|
| 0 701 142 A1 | 3/1996 | European Pat. Off. . |
| A-01091482 | 4/1989 | Japan . |
| 070 66033 A | 3/1995 | Japan . |
| A-08129721 | 5/1996 | Japan . |
| A-08153314 | 6/1996 | Japan . |

OTHER PUBLICATIONS

McGuire T.R. et al., "Effectiveness of Antiferromagnetic Oxide Exchange for Sandwich Layers", *IEEE Transactions on Magnetics*, vol. 29, No. 6, Nov. 1, 1993, pp. 2714–2716.

Taguchi et al., "Giant Magnetoresistance in Co/Cu/Co Sandwiches", *Journal of Applied Magnetics Society of Japan*, vol. 18, No. 2, 1994, pp. 321–325, with partial translation.

Takashima et al., "Influences of Buffer Layers on the Magnetoresistance of Co/Cu/Co Films", *Journal of Applied Magnetics Society of Japan*, vol. 19, No. 2, 1995, pp. 381–384, with partial translation.

Deguchi et al., "Magnetoresistance of Sandwich Films with Co–oxide", *Proceedings of the 20$^{th}$ Meeting of the Applied Magnetics Society of Japan*, 1996, pp. 272, with partial translation.

McGuire et al., "Magnetization and Magnetoresistance of Co/Cu Layered Films", *IEEE Transactions on Magnetics*, vol. 28, No. 5, Sep. 1992, pp. 2748–2750.

McGuire et al., "Effectiveness of Antiferromagnetic Oxide Exchange for Sandwich Layers", *IEEE Transactions of Magnetics*, vol. 29, No. 6, Nov. 1993, pp. 2714–2716.

*Primary Examiner*—A. J. Heinz
*Attorney, Agent, or Firm*—David G. Conlin; George W. Neuner

[57] ABSTRACT

A magnetoresistive effect device is formed by layering a nonmagnetic Co oxide film, a pinned magnetization layer made of Co, a nonmagnetic layer made of Cu, a free magnetization layer made of NiFe in this order on a substrate made of glass or Si. By arranging the nonmagnetic Co oxide film in contact with the pinned magnetization layer, it is possible to produce a magnetoresistive effect device with a high saturation field and a high sensitivity.

27 Claims, 18 Drawing Sheets

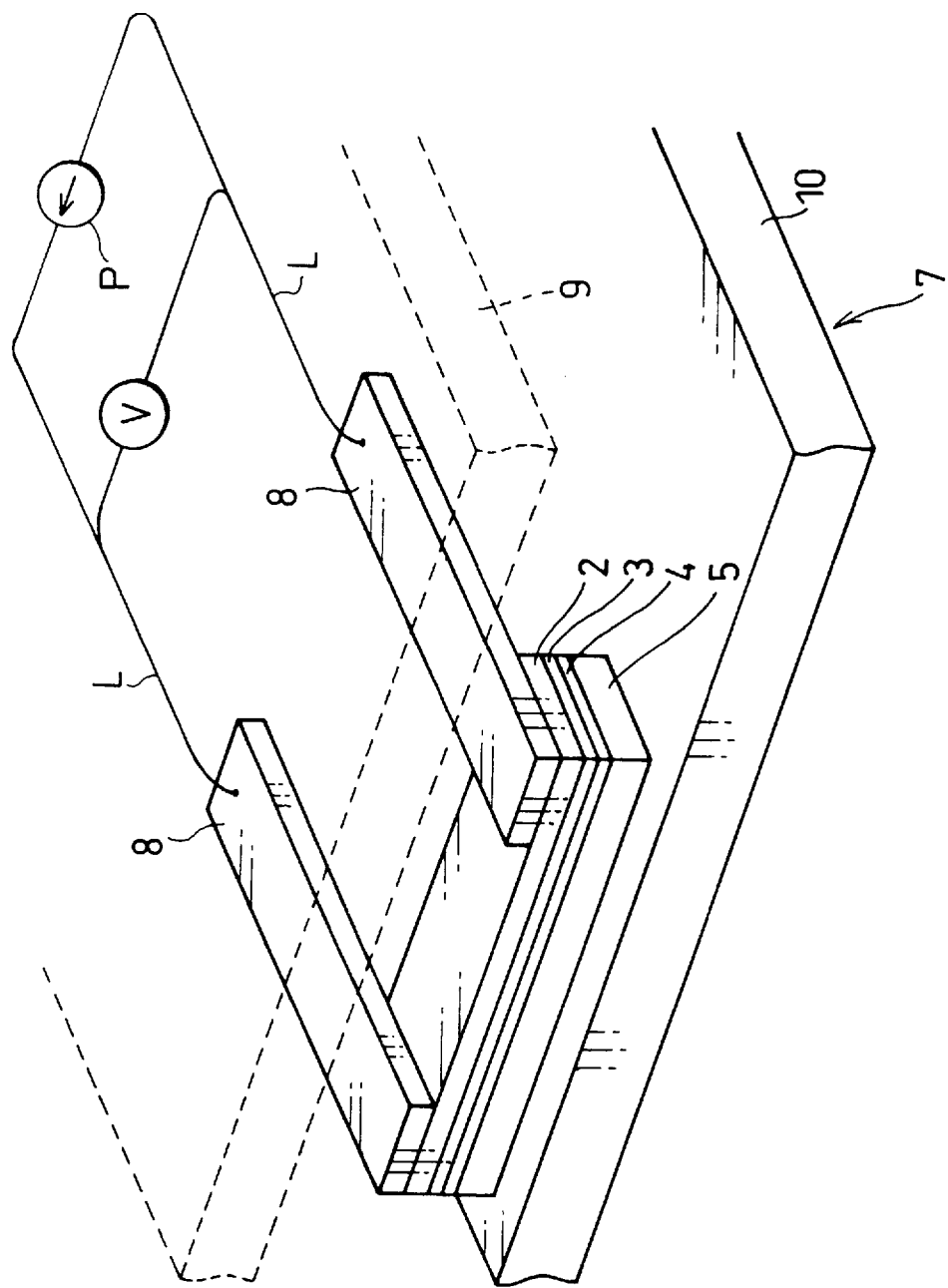

MAGNETORESISTIVE EFFECT DEVICE UTILIZING AN OXIDE LAYER ADJACENT ONE OF THE MAGNETIC LAYERS

FIELD OF THE INVENTION

The present invention particularly relates to a magnetoresistive effect device formed by a sandwich film of a three-layer structure among multilayer films which exhibit an extremely large magnetoresistive effect (so-called giant magnetoresistive effect) and are constructed by sandwiching a nonmagnetic layer between ferromagnetic layers for use in a magnetic recording and reproducing head or a magnetic sensor utilizing the magnetoresistive effect, and to a process for producing the magnetoresistive effect device, and a magnetic head produced using the magnetoresistive effect device.

BACKGROUND OF THE INVENTION

In the field of magnetic recording and reproducing apparatuses like magnetic disk apparatuses and magnetic tape apparatuses, an increase in the recording density has created a demand for an improvement of the performance of magnetic heads such as recording heads and reproduction heads, particularly in reading information recorded on a magnetic recording medium.

More specifically, with an increase in the coercive force of the magnetic recording medium, a material with a high saturation magnetic flux density is required for the recording head. With regard to the reproduction head, an attempt for increasing the reproduction output has been made by the use of a so-called MR (magnetoresistive effect) head utilizing the magnetoresistive effect instead of a conventional induction type head. The reason for this is to deal with the problem of a lowering of the relative velocity of the magnetic head to the magnetic recording medium, which arises with a decrease in the size of the magnetic recording medium. The magnetoresistive effect is an effect of changing the electrical resistance of a material according to a change in the external magnetic field.

As a material exhibiting such a magnetoresistive effect, magnetic thin films made of NiFe or NiCo, for example, Permalloy, are known. The MR ratio of these thin films is around 2 to 3% for NiFe, and has a maximum value of around 6% for NiCo.

The magnetoresistive effect of such a magnetic thin film is produced by the spin-orbit interaction, and depends on the angle between the direction of a measuring current and the magnetization direction of the magnetic thin film. Such a magnetoresistive effect is usually called an anisotropic magnetoresistive effect (AMR). In order to further improve the recording density of the medium, it is necessary to develop a new material having a higher MR ratio than the material showing the AMR.

In recent years, a phenomenon called a giant magnetoresistive effect (GMR), which exhibits the magnetoresistive effect based on a principle that differs from the principle of the AMR, was observed and has become the focus of attention. One example of a film having a structure showing the GMR (hereinafter referred to as the "GMR film") is a multilayer film formed by layering some ten magnetic layers and nonmagnetic layers by turns.

As illustrated in FIG. 20, the multilayer film has a multilayer structure produced by alternately depositing, for example, a thin magnetic film 32 like Co and a nonmagnetic layer 32 like Cu. In the multilayer film, adjacent magnetic layers 31 are coupled by a strong antiferromagnetic coupling. Therefore, when an external magnetic field is not present, the magnetization directions of the magnetic layers 31 are antiparallel (differ from each other by 180°). On the other hand, when an external magnetic field is applied, the directions of magnetization of the magnetic layers 31 are all aligned with the direction of the magnetic field, and thus become parallel.

The electrical resistance of the multilayer film shows a resistance change in proportion to the cosine of the angle between the magnetization directions of the magnetic layers 31 which are placed one upon another with a single nonmagnetic layer 32 therebetween. The reason for this is that the scattering of the conduction electrons varies according to the angle between these magnetic layers 31. Namely, when the magnetizations of adjacent magnetic layers 31 are antiparallel, the scattering of the conduction electrons increases, and the resistance of the film becomes a maximum. On the other hand, when the magnetizations of these magnetic layers 31 are parallel, the scattering of the conduction electrons decreases, and the resistance of the film becomes a minimum.

The MR ratio of the multilayer film is greater than that of the AMR by at least a one-digit scale. In a Co/Cu multilayer film produced by materials showing a maximum resistance change at present, an MR ratio of not lower than 60% is achieved even at ordinary temperature.

As described above, the GMR film of a multilayer structure like the multilayer film shown in FIG. 20 has an extremely high MR ratio. However, in this film, the coupling between the magnetic layers 31 is too strong. Therefore, in order to achieve a high MR ratio with this film, an extremely large magnetic field ranging from several hundreds Oe to several kOe (1 Oe=79.6 A/m) needs to be applied.

The reason for this is that the antiparallel state of the magnetizations without an external magnetic field can be achieved by the use of the exchange interaction between the magnetic layers 31. The coupling between the interacting magnetic layers 31 is extremely strong. Therefore, in order to bring the magnetizations of the magnetic layers 31 into a parallel state by cutting off the exchange interaction, an extremely high external magnetic field is required.

Thus, the use of this film in the magnetic head and the like is not practical because this film has a low sensitivity to a weak external magnetic field (the ratio of change in the magnetoresistance to a change in the external magnetic field). As a result, the MR ratio within an operative magnetic field range of the magnetic head becomes smaller.

Then, in place of the multilayer film, a spin-valve magnetoresistive effect film (hereinafter referred to as the "spin-valve film") was invented so as to achieve an improvement of the sensitivity. The spin-valve film has an antiferromagnetic layer/magnetic layer/nonmagnetic layer/magnetic layer structure. In this structure, the magnetization of one of the magnetic layers is fixed in one direction by using the exchange coupling between this magnetic layer and the antiferromagnetic layer. On the other hand, the magnetization of the other magnetic layer freely rotates according to the external magnetic field. By using a thin film made of a magnetic material having high softness like NiFe as the latter magnetic layer, the sensitivity can be improved. In the following description, the magnetic layer having a fixed magnetization direction is called the "pinned magnetization layer", and the magnetic layer whose magnetization direction freely rotates is called the "free magnetization layer".

For example, such a spin-valve film is disclosed in Japanese Publication for Unexamined Patent Application No. 358310/1992 (Tokukaihei 4-358310). FIG. 21 shows a schematic cross sectional structure of the spin-valve film. As illustrated in FIG. 21, a pinned magnetization layer 43 and a free magnetization film 41 are layered with a nonmagnetic layer 42 therebetween. Moreover, an antiferromagnetic layer 44 of, for example, manganese iron (FeMn), is deposited next to the pinned magnetization layer 43. Thus, an exchange bias produced by the exchange interaction between the pinned magnetization layer 43 and the antiferromagnetic layer 44 is applied to the pinned magnetization layer 43. As a result, the magnetization of the pinned magnetization layer 43 is fixed in one direction.

On the other hand, the free magnetization layer 41 is deposited so that the angle between the magnetization direction of the free magnetization layer 41 and that of the pinned magnetization layer 43 is 90° when the external magnetic field is zero. By changing the direction of the external magnetic field, the magnetization direction of the free magnetization layer 41 can be freely changed.

Therefore, when an external magnetic field is applied to the above-mentioned film in the direction of the magnetization of the pinned magnetization layer 43, the magnetization directions of the two magnetic layers 41 and 43 become parallel. On the other hand, when the external magnetic field is applied to the film in a direction opposite to the magnetization direction of the pinned magnetization layer 43, the magnetization directions of the two magnetic layers 41 and 43 become antiparallel. Consequently, similarly to the multilayer type magnetoresistive effect film, it is possible to obtain a magnetoresistive effect which depends on the cosine of the angle between the magnetization directions of the two layers with the spin-valve film.

The spin-valve film is a so-called non-coupled type magnetoresistive effect film having no antiferromagnetic coupling between the two magnetic layers 41 and 43. In this structure, the thicknesses of the magnetic layers 41 and 43 can be increased. It is therefore possible to increase the sensitivity of resistance change with respect to the external magnetic field. Considering the above-mentioned advantages, it would be said that the spin-valve film is one of the most practical GMR films.

It has also been known that the GMR is obtained by a sandwich type magnetoresistive effect film using no antiferromagnetic film (hereinafter referred to as the "sandwich film") typified by a Co/Cu/Co film. The structure of the sandwich film is substantially the same as the spin-valve film in theory. FIG. 22 is a cross sectional view showing a schematic structure of the sandwich film. As illustrated in FIG. 22, the sandwich film is constructed by layering a pinned magnetization layer 54 and a free magnetization film 52 on a substrate 51 with a nonmagnetic layer 53 therebetween. Both of the pinned magnetization layer 54 and the free magnetization film 52 are formed by Co.

A Co oxide layer (not shown) is formed by natural oxidation on the surface of the pinned magnetization layer 54. The coercive force of the pinned magnetization layer 54 is increased by the Co oxide layer, and the magnetization direction of the pinned magnetization layer 54 is fixed in the initial magnetized direction within the operating magnetic field range. On the other hand, the magnetization of the free magnetization layer 52 which is not oxidized can freely rotate. Therefore, similarly to the above-mentioned spin-valve film, the angle between the magnetization directions of the two magnetic layers 52 and 54 of the sandwich film is varied by the external magnetic field, thereby producing the magnetoresistive effect. In this case, an antiferromagnetic coupling is not present between the two magnetic layers 52 and 54. It is thus possible to increase the thicknesses of the magnetic layers 52 and 54, and enhance the sensitivity of resistance change with respect to the external magnetic field.

As described above, it has been reported that the GMR is exhibited by a so-called non-coupled structure which uses a thin film of Co or NiFe for magnetic layers, and the difference in coercive force between two magnetic layers, instead of using the antiferromagnetic coupling between the magnetic layers.

The following description will explain the prior arts relating to the non-coupled spin-valve film and sandwich film.

① Document (1), "Magnetization and Magnetoresistance of Co/Cu Layered Films", IEEE Transactions on Magnetics, Vol. 28, No. 5, 1992, discloses a structure of a so-called sandwich film having a very simple Co/Cu/Co layered structure. A Co oxide film is formed by natural oxidation on one of the Co surfaces of this film.

② Document (2), "Effectiveness of Antiferromagnetic Oxide Exchange for Sandwich Layers", IEEE Transactions on Magnetics, Vol. 29, No. 6, 1993, discloses a structure in which a Co oxide film is formed on a Co/Cu/Co sandwich film by reactive sputtering using a 10% oxygen gas. It is considered that the Co oxide film is CoO which is an antiferromagnetic material whose Néel point is in the vicinity of room temperature (290 K).

It is reported that the magnetoresistive effect is produced at extremely low temperatures in the sandwich films of Documents (1) and (2). In such a sandwich film, it is considered that the exchange coupling between CoO and Co occurs when the surface of the top Co layer is oxidized or when CoO is formed by reactive sputtering. The coercive force of the Co layer adjacent to CoO is increased by the antiferromagnetic alignment, thereby producing a difference between the coercive forces of the magnetic layers sandwiching the nonmagnetic layer therebetween. Thus, the GMR is produced by these films.

③ Document (3), "Magnetoresistive Effect of Co/Cu/Co Sandwich Film", Transactions of the Japanese Applied Magnetics Society, Vol. 18, No. 2, 1994, discloses a structure in which a Co/Cu/Co sandwich film is formed on a buffer layer made of Fe or NiFe, and a Co oxide film is formed on the surface of the Co layer by natural oxidation. In this structure, the magnetoresistive effect is obtained by producing a difference in the saturation field between the two magnetic layers and by achieving the antiparallel magnetizations with the formation of the Co oxide film. The saturation field of the magnetic layer is the strength of an external magnetic field which must be applied to switch the direction of magnetization of the pinned magnetic layer. This document reports that the GMR as high as 6 to 15% is obtained even at room temperature by the use of the buffer layer made of Fe or NiFe.

④ Document (4), "The Effect of Buffer Layer in the Magnetoresistive Effect of Co/Cu/Co Sandwich Film", Transactions of Japanese Applied Magnetics Society, Vol. 19, No. 2, 1995, discloses a structure in which a Co/Cu/Co sandwich film is formed on a buffer layer made of Fe or NiFe like Document (3).

The spin-valve film shown in FIG. 21 and the sandwich film shown in FIG. 22 are non-coupled type magnetoresistive effect films. Therefore, if the coupling between the magnetic layers (interlayer coupling) is strong, the magnetization directions of the two layers do not become antiparallel, causing a problem that the GMR is not obtained. Namely, in order to obtain the GMR by achieving an antiparallel state of the magnetization directions of the two layers, it is necessary to weaken the coupling between the magnetic layers. Document (4) focused on this problem, and reported a method of weakening the coupling between the magnetic layers by forming a Fe or NiFe layer as the buffer layer of the Co/Cu/Co sandwich film.

⑤ Document (5), Japanese Publication for Unexamined Patent Application No. 66033/1995 (Tokukaihei 7-66033), discloses a substrate/buffer layer/Co/Cu/Co structure or a substrate/buffer layer/Co/cu/co/cap layer structure. In this structure, CoO as an antiferromagnetic material is used for the buffer layer or the cap layer. The magnetoresistive effect is improved by fixing the magnetization of the adjacent Co layer with the CoO.

With the prior arts of ② and ⑤, the magnetization of the Co layer is fixed by layering CoO on the Co layer as the pinned magnetization layer by reactive sputtering. However, the Néel point of such an antiferromagnetic material, CoO, is not high. Consequently, the exchange coupled magnetic field for fixing the magnetization of the Co layer is weak at room temperature, and the antiparallel state of the magnetization directions cannot be achieved. Namely, there is a problem that the magnetoresistive effect is only obtained at low temperatures.

With the prior arts of ①, ③ and ④, the surface of the Co layer as the pinned magnetization layer is subjected to natural oxidation. However, since the natural oxide film (i.e., the film oxidized by air) is used, it is not easy to control the magnetic properties of the pinned magnetization layer. Moreover, since the saturation field of the pinned magnetization layer is decreased, the pinned magnetization layer is not stable with respect to the external magnetic field. In particular, in a structure using NiFe as the free magnetization layer for improving the sensitivity, the saturation field of the pinned magnetization layer is so small and the maximum saturation field is 16000 A/m (200 Oe). Thus, this structure is not practicable.

Further, there are reports on the buffer layer of the Co/Cu/Co sandwich film in the above-mentioned prior art documents, ③ to ⑤. However, Document (4) mentioned in ④ describes that the GMR is not obtained with a Co/Cu/Co structure having no buffer layer. Namely, the MR ratio depends greatly on the material and thickness of the buffer layer. In order to obtain a high MR ratio, it is necessary to form a buffer layer with a thickness of around 70 Å when Fe is used, or around 100 Å when NiFe is used. Thus, in the method of weakening the coupling between the magnetic layers by providing the Fe or NiFe layer as the buffer layer of the sandwich film, the effect cannot be obtained unless the Fe or NiFe buffer layer has a very large thickness. Thus, the overall resistance of such a sandwich film is much lower compared to a film having no buffer layer. Consequently, a high reproduction output cannot be obtained.

In order to obtain a high reproduction output, it is necessary to achieve a high MR ratio without lowering the resistance of the film. However, since the specific resistivity of Fe and NiFe is as small as 20 to 30 $\mu\Omega$cm, if Fe or NiFe is used as the buffer layer, the resistance of the film is lowered. Moreover, the film structure is limited because the buffer layer is essential. Thus, there is a problem that the degree of freedom in designing the structure of a magnetoresistive effect device is small.

Japanese Publication for Unexamined Patent Application No. 65329/1995 (Tokukaihei 7-65329) discloses a sandwich structure using a high coercive force film instead of the antiferromagnetic layer. In this structure, a change in resistance is produced with a low external magnetic field by using an alloy of Co—Pt or other alloys, such as Co—Cr and Co—Ta, containing Co as a main component, as the high coercive force film.

However, the MR ratio obtained by the structure disclosed in this publication is so low as on the order of 3%. The reason for this is that since the Co alloy normally has a specific resistivity as low as some ten $\mu\Omega$cm, the separation of the current to the Co alloy layer occurs. Furthermore, in this structure, in order to increase the MR ratio, it is considered to decrease the thickness of the Co—Pt film as thin as possible or reduce the Pt composition. However, both of these methods cause a lowering of the coercive force.

SUMMARY OF THE INVENTION

It is a first object of the present invention to provide a magnetoresistive effect device capable of obtaining a high MR ratio, high saturation field, and high sensitivity even at room temperature by forming a nonmagnetic oxide layer next to a pinned magnetization layer.

In order to achieve the first object, a magnetoresistive effect device of the present invention includes:

a magnetoresistive effect film having a first magnetic layer whose magnetization direction rotates according to an external magnetic field, a nonmagnetic layer formed next to the first magnetic layer, and a second magnetic layer whose magnetization direction is fixed in one direction, the second magnetic layer being placed next to the nonmagnetic layer, the magnetoresistive effect film having a magnetoresistive effect produced by the angle between the magnetization directions of the first and second magnetic layers; and a nonmagnetic oxide layer adjacent to the second magnetic layer of the magnetoresistive effect film.

In this structure, the magnetization direction of the second magnetic layer is fixed in one direction, and the magnetization direction of the first magnetic layer freely rotates. Therefore, when a magnetic field is applied to this structure, the magnetization direction of the first magnetic layer is determined. When the magnetization directions of the two magnetic layers are antiparallel and have a 180° opposite state, the film has a maximum resistance. On the other hand, when the magnetization directions are parallel, the film has a minimum resistance, thereby producing the magnetoresistive effect.

In this structure, by providing a nonmagnetic oxide layer in contact with the second magnetic layer for fixing the magnetization direction, the coercive force of the second magnetic layer is increased. As a result, a difference is produced between the coercive forces of the first and second magnetic layers, and a high MR ratio is obtained.

In the magnetoresistive effect device disclosed in the prior art document mentioned in ⑤, since the Co oxide showing antiferromagnetic properties is used, the magnetoresistive effect cannot be obtained at room temperature. On the other hand, in the present invention, since the nonmagnetic oxide layer is used, the coercive force of the multilayer film formed by the oxide layer and the second magnetic layer can be increased. It is thus possible to provide a magnetoresistive effect device which is stable with respect to an external magnetic field by increasing the saturation field of the magnetoresistive effect.

It is a second object of the present invention to provide a magnetoresistive effect device having a high output, a high MR ratio and a large device resistance without using a metallic buffer layer.

In order to achieve the second object, the magnetoresistive effect device of the present invention includes:

a magnetoresistive effect film including a first magnetic layer whose magnetization direction rotates according to an external magnetic field, a nonmagnetic layer adjacent to the first magnetic layer, and a second magnetic layer whose magnetization direction is fixed in one direction, the second magnetic layer being placed next to the nonmagnetic layer, the magnetoresistive effect film having a magnetoresistive effect produced by the angle between the magnetization directions of the first and second magnetic layers; and a Co oxide layer as a buffer layer of the first magnetic layer of the magnetoresistive effect film.

In this structure, the Co oxide layer is provided as the buffer layer of the fist magnetic layer whose magnetization is not fixed. As a result, the interlayer coupling between the first and second magnetic layers is reduced, thereby increasing the MR ratio.

It is considered that the crystal orientation or the layer interface changes due to the Co oxide. It is also considered that the change of the interface weakens the coupling between the magnetization of the first magnetic layer and the second magnetic layer, thereby producing a large magnetoresistive effect.

Unlike conventional Fe or NiFe, such a Co oxide buffer layer has a specific resistivity in the order of mΩcm. Consequently, it is possible to obtain a high MR ratio without causing a substantial lowering of the overall resistance of the magnetoresistive effect film.

In the magnetoresistive effect device disclosed in the prior art document mentioned in ⑤, the Co oxide showing antiferromagnetic properties is used for the purpose of fixing the magnetization of the adjacent oxide layer. This Co oxide layer cannot be provided as the buffer layer of the free magnetization layer nor used for the purpose of weakening the coupling between the first and second magnetic layers.

For a fuller understanding of the nature and advantages of the invention, reference should be made to the ensuing detailed description taken in conjunction with the accompanying drawings.

BRIEF DESCRIPTION OF THE DRAWINGS

FIG. 16(a) is a perspective view showing the structure of a magnetic head to which the magnetoresistive effect device of Embodiment 1 is applied.

DESCRIPTION OF THE PREFERRED EMBODIMENTS

[Embodiment 1]

The following description will explain Embodiment 1 of the present invention.

Figure 1:
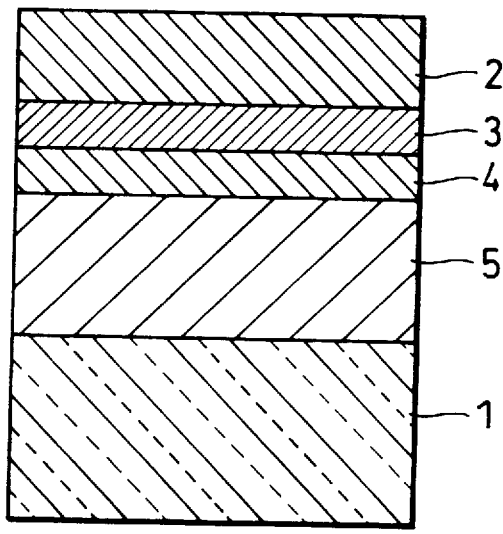
FIG. 1 is a cross sectional view showing the film structure of a magnetoresistive effect device according to Embodiment 1 of the present invention.

As illustrated in FIG. 1, a magnetoresistive effect device of this embodiment is constructed by layering a nonmagnetic oxide layer 5, a pinned magnetization layer 4, a nonmagnetic layer 3, and a free magnetization layer 2 in this order on a substrate 1.

The nonmagnetic oxide layer 5 is formed by an oxide showing nonmagnetic properties at room temperature so as to fix the magnetization of the adjacent pinned magnetization layer 4. As the nonmagnetic oxide, it is possible to use oxides of ferromagnetic materials, such as Co, Fe, and Ni. The specific resistivity of such a nonmagnetic oxide is some Ωcm.

The pinned magnetization layer (second magnetic layer) 4 is formed by a thin film of ferromagnetic material. The pinned magnetization layer 4 has a large coercive force, and a magnetization fixed in one direction. As the pinned magnetization layer 4, it is possible to use a ferromagnetic material like Co.

The nonmagnetic layer 3 is formed by a nonmagnetic metal like Cu.

The free magnetization layer (first magnetic layer) 2 is formed by a thin film of ferromagnetic material. It is possible to use a NiFe layer, Co layer, Fe layer or composite layer of Co and NiFe for the free magnetization layer 2.

The free magnetization layer 2 and the pinned magnetization layer 4 can be deposited by RF (radio frequency) magnetron sputtering using argon gas. The nonmagnetic layer 3 can be deposited by DC (direct current) magnetron sputtering using argon gas.

The nonmagnetic oxide layer 5 can be deposited by reactive RF magnetron sputtering. In this case, a ferromagnetic material like Co, Ni or Fe is used as a sputtering target, and a mixed gas of Ar and $O_2$ is used as a sputtering gas.

Next, the sputtering conditions for forming the nonmagnetic oxide layer 5 will be explained. The results of measurements when a Co oxide film was used as the nonmagnetic oxide layer 5 are discussed in the following description.

Figure 3:
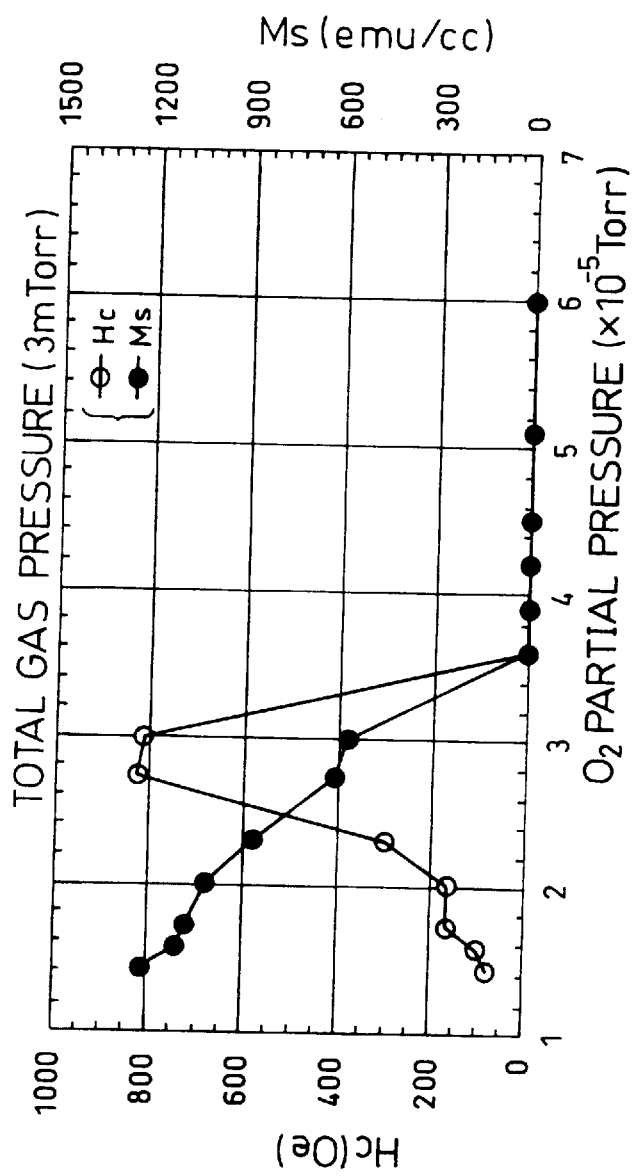
FIG. 3 is a graph showing changes in the coercive force and magnetization of a Co oxide film with respect to the partial pressure of oxygen when the total gas pressure is 3 mTorr.
Figure 4:
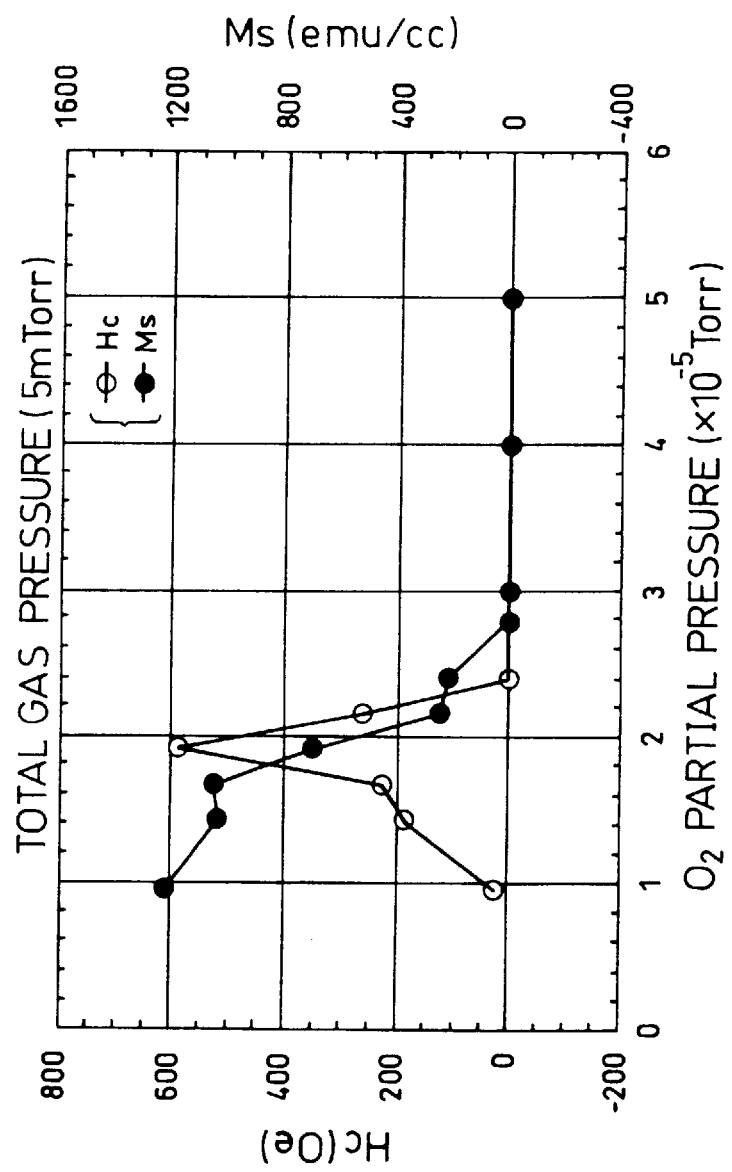
FIG. 4 is a graph showing changes in the coercive force and magnetization of the Co oxide film with respect to the partial pressure of oxygen when the total gas pressure is 5 mTorr.

FIGS. 3 and 4 show the results of measuring the changes in the coercive force (Hc) and magnetization (Ms) of the Co oxide film depending on the partial pressure of oxygen in depositing the film.

First, Co oxide films were deposited by setting the total gas pressure of the mixed gas of Ar and $O_2$ at 3 mTorr and varying the partial pressure of oxygen of the gas. Then, the coercive forces and magnetizations of these Co oxide films were measured at room temperature. FIG. 3 is a graph showing the dependance of the coercive force and magnetization of a Co oxide film on the partial pressure of oxygen in depositing the film according to the results of the measurements.

It is clear from FIG. 3 that a Co oxide film having a high coercive force of not lower than 32000 A/m (400 Oe) is obtained at a partial pressure of oxygen ranging from about $2.5 \times 10^{-5}$ Torr to $3.0 \times 10^{-5}$ Torr when the total gas pressure is 3 mTorr. It is also known that the coercive force of the Co oxide film has a maximum value in the vicinity of $2.8 \times 10^{-5}$ Torr.

When the partial pressure of oxygen is further increased, the coercive force of the Co oxide film is decreased, and becomes zero at about $3.5 \times 10^{-5}$ Torr. On the other hand, the magnetization of the Co oxide film is monotonously lowered with the increase in the partial pressure of oxygen, and also becomes zero at about $3.5 \times 10^{-5}$ Torr like the coercive force.

In addition, Co oxide films were deposited by setting the total gas pressure of the mixed gas at 5 mTorr and varying the partial pressure of oxygen of the gas. Then, the coercive forces and magnetizations of these Co oxide films were measured at room temperature. FIG. 4 is a graph showing the dependance of the coercive force and magnetization of a Co oxide film on the partial pressure of oxygen in depositing the film according to the results of the measurements.

In this case, the coercive force shows a maximum value when the partial pressure of oxygen is about $2.0 \times 10^{-5}$ Torr and becomes zero at $2.4 \times 10^{-5}$ Torr. On the other hand, the magnetization of the Co oxide film is monotonously lowered with the increase in the partial pressure of oxygen, and becomes zero at $2.8 \times 10^{-5}$ Torr.

It is found from the results that the Co oxide film changes from a ferromagnetic material to a nonmagnetic material at room temperature by depositing the Co oxide film at a partial pressure of oxygen of about $3.5 \times 10^{-5}$ Torr when the total gas pressure is 3 mTorr. The Co oxide film also changes to a nonmagnetic material at room temperature by depositing the Co oxide film at a partial pressure of oxygen of $2.8 \times 10^{-5}$ Torr when the total gas pressure is 5 mTorr.

Figure 8:
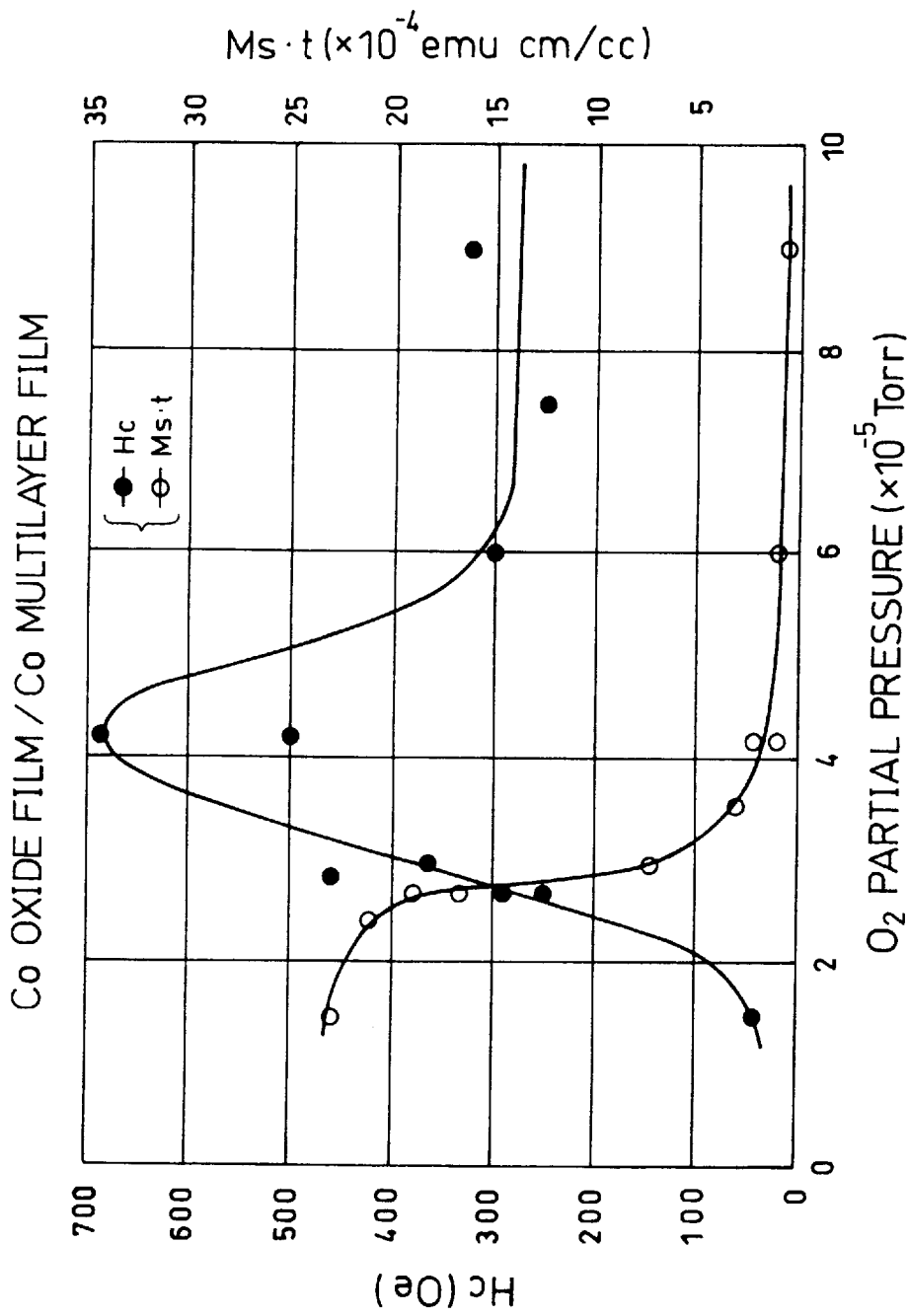
FIG. 8 is a graph showing the dependance of the coercive force of the Co oxide film/Co multilayer film on the partial pressure of oxygen.

FIG. 8 is a graph showing the dependance of the coercive force and Ms·t of a multilayer film formed by depositing a Co oxide film and Co at a total gas pressure of 3 mTorr, on the partial pressure of oxygen in depositing the film. Here, Ms·t is a product of the saturation magnetization and thickness of the multilayer film. The coercive force and Ms·t were measured at room temperature.

As illustrated in FIG. 8, the coercive force of the multilayer film abruptly increases with the increase in the partial pressure of oxygen. The coercive force of the multilayer film shows a maximum value when the partial pressure of oxygen is about $4.0 \times 10^{-5}$ Torr which is higher than the partial pressure of oxygen at which the magnetization of the Co oxide film becomes zero as shown in FIG. 3 (about $3.50 \times 10^{-5}$ Torr). When the partial pressure of oxygen is further increased, the coercive force moderately decreases. When the partial pressure of oxygen exceeds $6.0 \times 10^{-5}$ Torr, the coercive force converges to a constant value of about 24000 A/m (about 300 Oe).

Meanwhile, Ms·t of the multilayer film has the same tendency as the saturation magnetization of the Co oxide film shown in FIG. 3. Like the coercive force, the value of the partial pressure of oxygen at which the value of Ms·t becomes substantially zero is shifted to a higher value. Namely, when the partial pressure of oxygen is about $3.0 \times 10{-}5$ Torr, Ms·t abruptly decreases. When the partial pressure of oxygen is about $4.0 \times 10^{-5}$ Torr, Ms·t becomes substantially zero.

As described above, by appropriately controlling the partial pressure of oxygen, it is possible to form the nonmagnetic Co oxide film by reactive sputtering. The appropriate control of the partial pressure of oxygen is executed by controlling the partial pressure of oxygen in the mixed gas of Ar and oxygen so that the composition of oxygen in the resultant Co oxide film lies between a first oxygen composition and a second oxygen composition as to be described below.

The first oxygen composition is an oxygen composition for making Co nonmagnetic. The second oxygen composition is an oxygen composition just before an oxygen composition for causing the coercive force of the multilayer film formed by the Co oxide film and Co to be focused on a substantially constant value.

Figure 5:
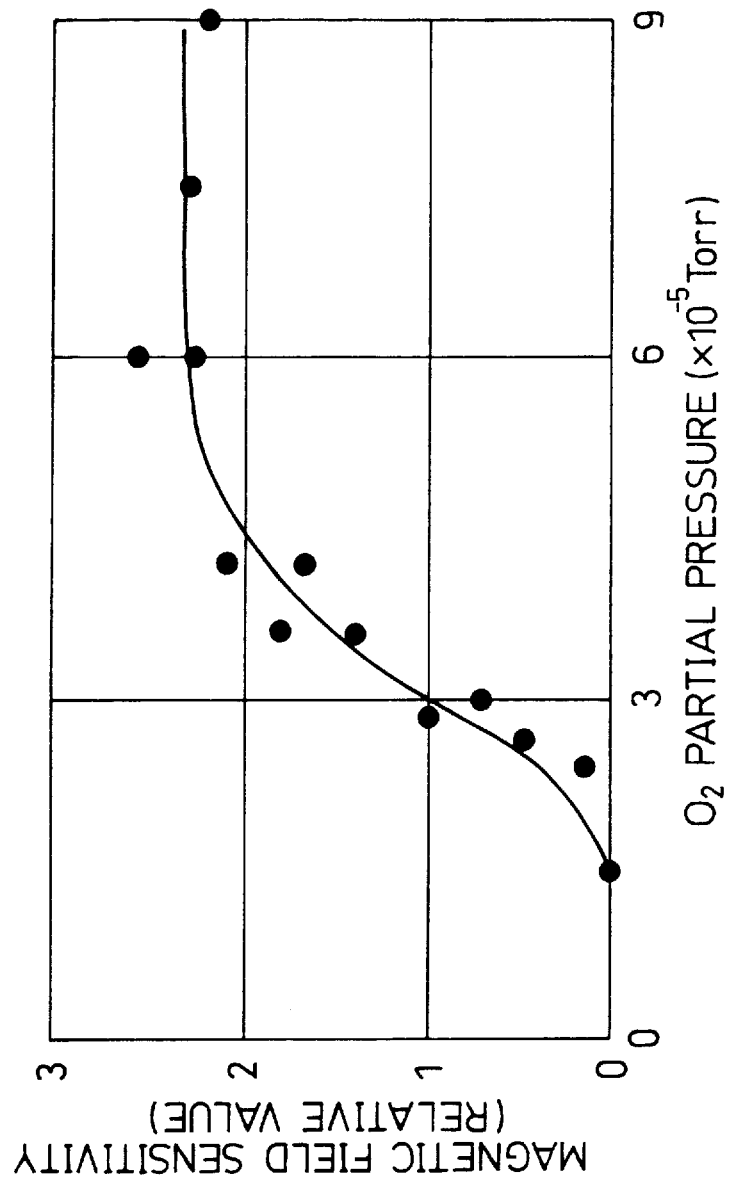
FIG. 5 is a graph showing the dependance of the sensitivity of the magnetoresistive effect device of Embodiment 1 on the partial pressure of oxygen.
Figure 6:
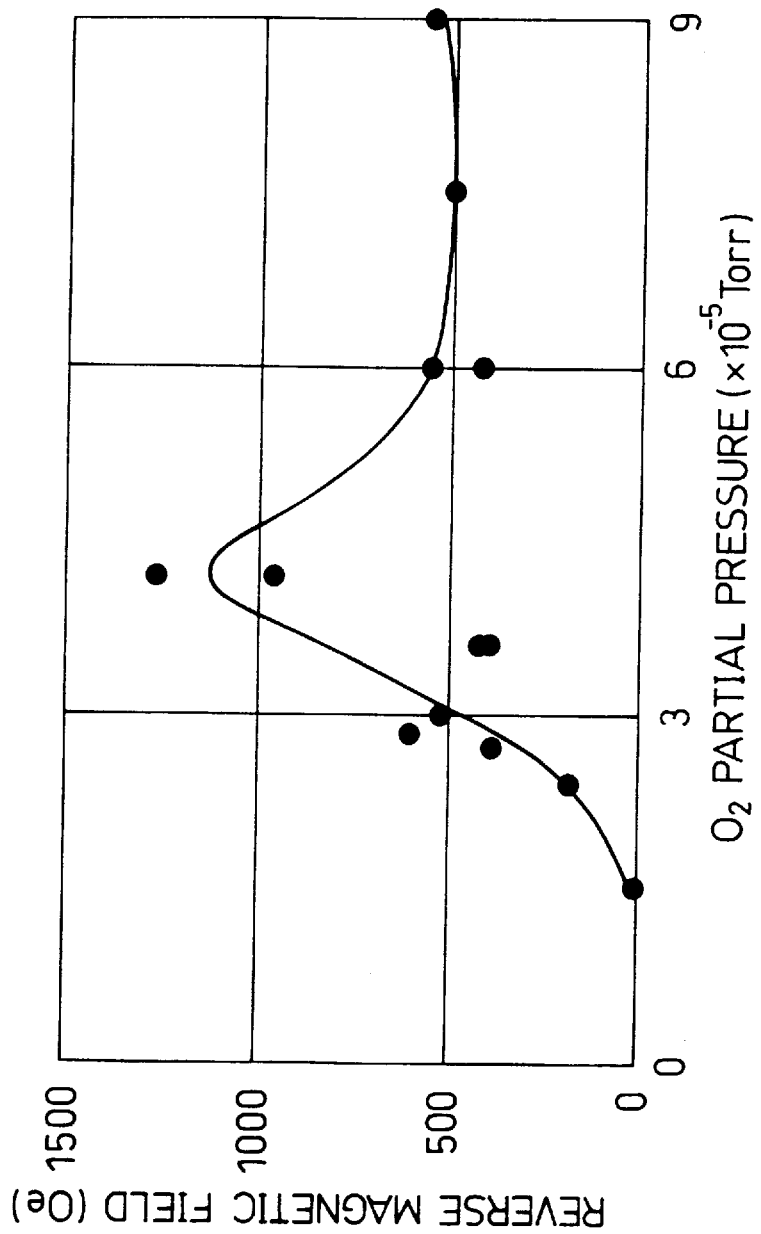
FIG. 6 is a graph showing the dependance of a saturation field of the magnetoresistive effect device on the partial pressure of oxygen.
Figure 7:
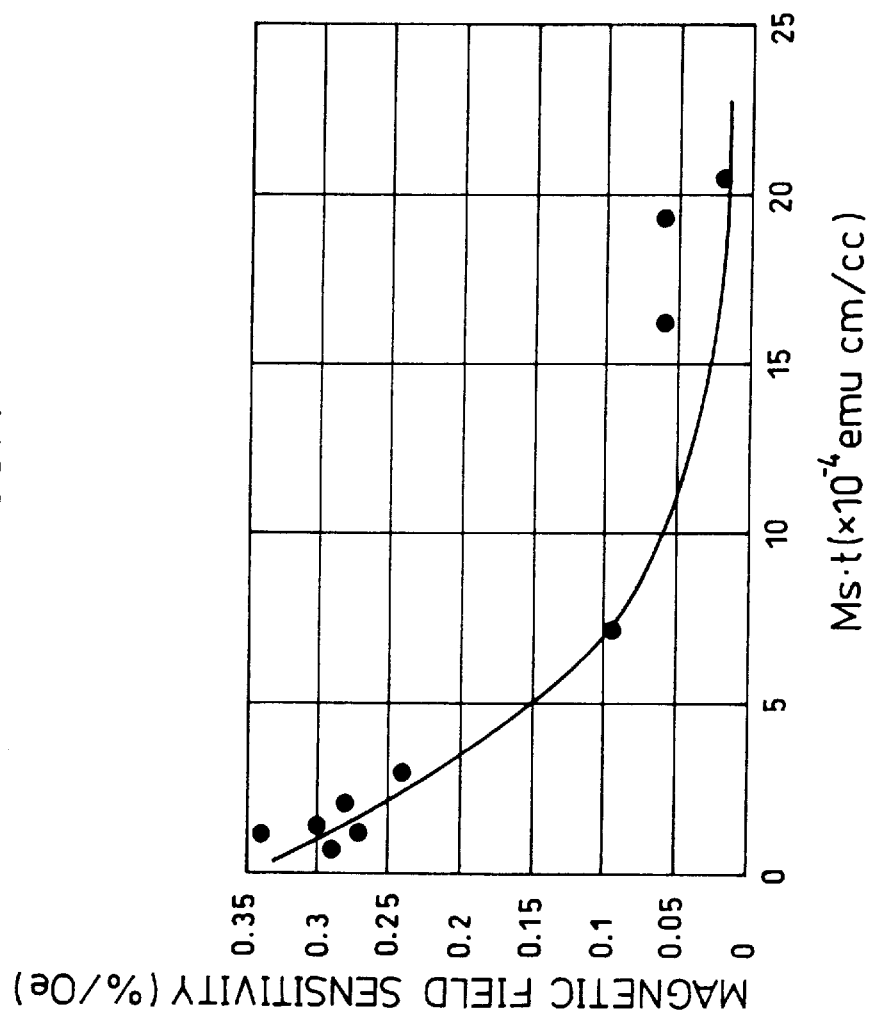
FIG. 7 is a graph showing the correlation between the Ms·t of Co of a Co oxide film/Co multilayer film and the sensitivity.

Next, magnetoresistive effect devices using a Co oxide film as the nonmagnetic oxide layer 5 were prepared by setting the total gas pressure at 3 mTorr and varying the partial pressure of oxygen. The magnetics properties of the magnetoresistive effect devices were measured. The results of the measurements are shown in FIGS. 5 to 7. In this case, the properties of the magnetoresistive effect were measured by a four-terminal method. All the measurements shown in FIGS. 5 to 7 were carried out at room temperature.

The magnetoresistive effect device was produced by layering on the substrate 1 the nonmagnetic oxide layer 5 made of a Co oxide film with a thickness of 200 Å, the pinned magnetization layer 4 made of a Co film with a thickness of 20 Å, the nonmagnetic layer 3 made of a Cu film with a thickness of 26 Å, and a free magnetization layer 2 made of a NiFe film with a thickness of 70 Å.

FIG. 6 is a graph showing the dependance of the saturation field of the magnetoresistive effect of the magnetoresistive effect device on the partial pressure of oxygen as a condition for depositing the nonmagnetic oxide layer 5. It is clear from FIG. 6 that the saturation field of the magnetoresistive effect showed a maximum value in the vicinity of about $4.2 \times 10^{-5}$ Torr with an increase in the partial pressure of oxygen. When the partial pressure of oxygen was further increased, the saturation field had such a tendency that the saturation field was stabilized at about 40000 A/m (about 500 Oe). In this case, at partial pressures of oxygen not lower than a partial pressure at which the Co oxide film becomes nonmagnetic (here, not lower than $3.5 \times 10^{-5}$ Torr), the maximum value of the saturation field was 100000 A/m (1250 Oe), and the minimum value thereof was about 32000 A/m (about 400 Oe). These values are sufficient for applying the magnetoresistive effect device to a magnetic apparatus.

FIG. 5 is a graph showing the dependance of the sensitivity of the magnetoresistive effect device on the partial pressure of oxygen as a condition for depositing the nonmagnetic oxide layer 5. In FIG. 5, the values of the sensitivity at the respective partial pressures of oxygen are normalized by the sensitivity obtained at $2.85 \times 10^{-5}$ Torr.

As illustrated in FIG. 5, the sensitivity monotonously increases with an increase in the partial pressure of oxygen, and is substantially saturated at partial pressures of oxygen of not lower than about $4.2 \times 10^{-5}$ Torr. Such a tendency is substantially in accord with the tendency to decrease the magnetization of the Co oxide film shown in FIG. 3. Namely, as the oxidation of Co proceeds by the increase in the partial pressure of oxygen, the magnetization of the Co oxide film is reduced, and the sensitivity of the magnetoresistive effect device is improved. When the Co oxide film is deposited by further increasing the partial pressure of oxygen, the oxidation of the Co oxide film further proceeds, and the increase in the sensitivity of the magnetoresistive effect device is saturated. This is achieved by depositing the Co oxide film at a partial pressure of oxygen which is substantially the same as the partial pressure of oxygen at which the magnetization of the Co oxide film is completely eliminated.

FIG. 7 is a graph showing the relationship between the Ms·t and sensitivity of a multilayer film formed by layering a Co oxide film deposited by reactive sputtering and Co. It is understood from FIG. 7 that the sensitivity decreases with an increase in Ms·t. There is good correlation between the decrease of Ms·t and the increase in the sensitivity.

It is conjectured from the above-mentioned measurements that the increase in the sensitivity due to the increase in the partial pressure of oxygen occurs for the following reason. Namely, when the magnetization of the pinned magnetization layer 4 adjacent to the Co oxide film decreases, the magnetostatic coupling between the pinned magnetization layer 4 and the free magnetization layer 2 is weakened, and thus the influence of the pinned magnetization layer 4 on the switching of the magnetization of the free magnetization layer 2 becomes smaller.

It is understood from the above-mentioned measurements that a magnetoresistive effect device having a high saturation field and high sensitivity of resistance change to a magnetic field at room temperature is obtained by using such sputtering conditions for forming a nonmagnetic Co oxide film. The above-mentioned sputtering conditions are satisfied by selecting an appropriate total gas pressure, partial pressure of oxygen, and power to be supplied so as to eliminate the magnetization of the Co oxide film. For example, when the total gas pressure is 3 mTorr, the magnetization of the Co oxide film is eliminated by controlling the partial pressure of oxygen not to be lower than $3.5 \times 10^{-5}$ Torr. When the total gas pressure is 5 mTorr, the magnetization of the Co oxide film is eliminated by controlling the partial pressure of oxygen not to be lower than $2.8 \times 10^{-5}$ Torr.

In order to obtain a magnetoresistive effect device with a large saturation field, it is necessary to use the pinned magnetization layer 4 with a high coercive force. As illustrated in FIG. 8, even in the magnetoresistive effect device which is deposited at a partial pressure of oxygen of $7.5 \times 10^{-5}$ Torr at which the coercive force converges to a constant value, a high saturation field and high sensitivity are obtained as shown in FIGS. 5 and 6. Namely, when the coercive force of the multilayer film of the Co oxide film and Co is not lower than 20000 A/m (250 Oe), there is a significant difference in the coercive force between the pinned magnetization layer 4 and the free magnetization layer 2. It is thus possible to produce a magnetoresistive effect device with a large saturation field. In this embodiment, therefore, the lower limit of the coercive force of the multilayer film of the nonmagnetic Co oxide film and Co was made 20000 A/m (250 Oe).

Since the optimum sputtering conditions vary depending on the sputtering devices, the above-mentioned conditions are not essential, but it is considered that there are similar tendencies on the whole. The conditions used in this embodiment are of one example.

The following description will explain samples of the magnetoresistive effect device.

Sample #1 was prepared by layering the nonmagnetic oxide layer 5 made of Co oxide with a thickness of 200 Å, the pinned magnetization layer 4 made of Co with a thickness of 20 Å, the nonmagnetic layer 3 made of Cu with a thickness of 26 Å, and the free magnetization layer 2 made of NiFe with a thickness of 70 Å on the substrate 1 formed by a glass substrate or Si (100) substrate.

The sputtering conditions for the respective layers are as follows. The Co oxide film was deposited by reactive RF magnetron sputtering in a 3 mTorr Ar +1.4% $O_2$ gas atmosphere at a deposition rate of 24 Å/min. The Co layer was deposited by RF magnetron sputtering at an Ar pressure of 5 mTorr and a deposition rate of 40 Å/min. The Cu layer was deposited by DC magnetron sputtering at an Ar pressure of 5 mTorr and a deposition rate of 32 Å/min. The NiFe layer was deposited by RF conventional sputtering at an Ar pressure of 5 mTorr and a deposition rate of 19 Å/min. In this case, the magnetization of the Co oxide film is zero as shown in FIG. 3, and therefore the Co oxide film is nonmagnetic.

Figure 9:
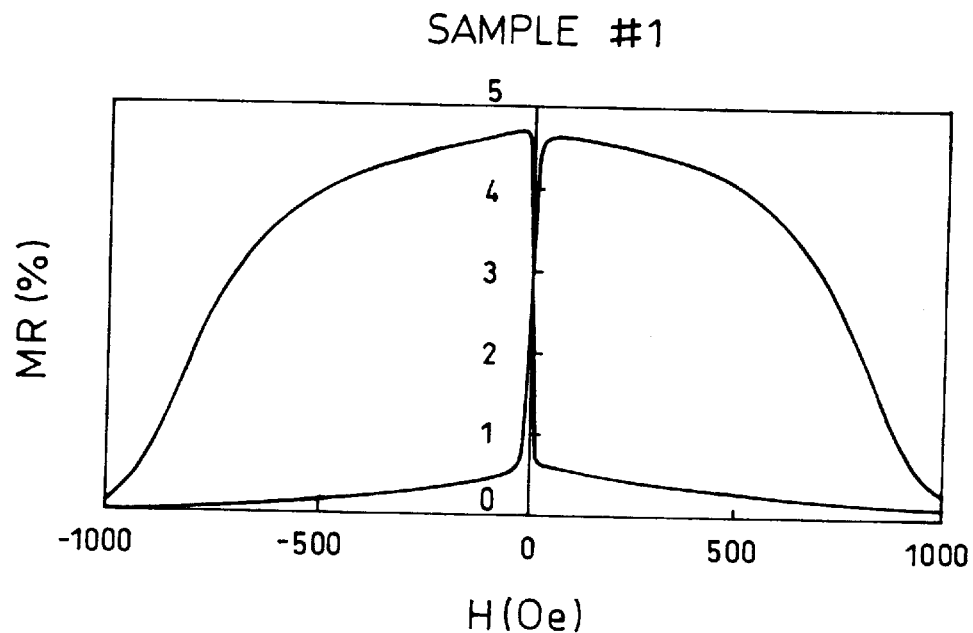
FIG. 9 is a graph showing the resistance curve of a magnetoresistive effect device as sample #1.
Figure 10:
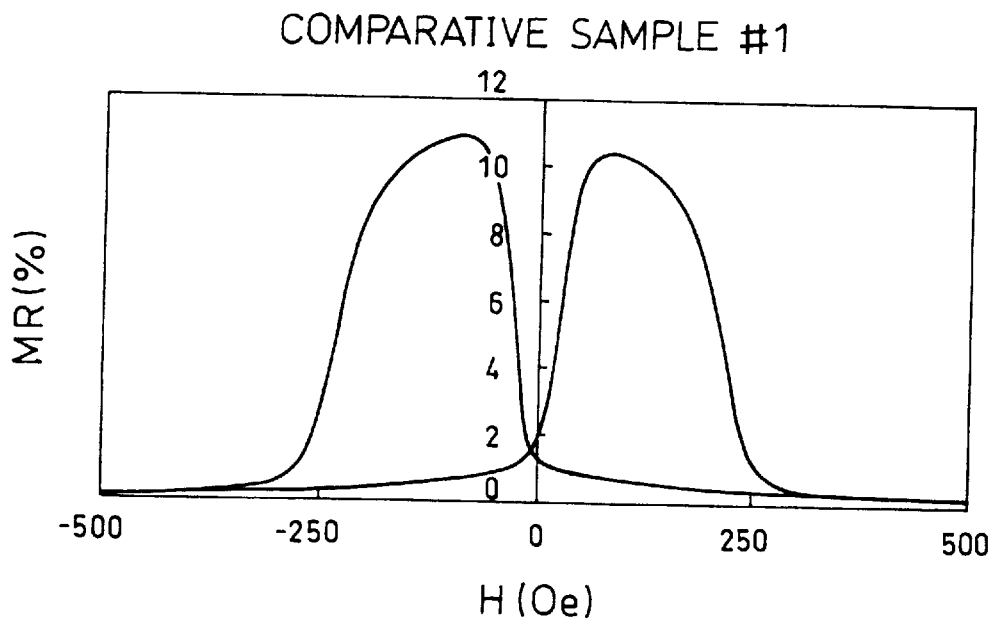
FIG. 10 is a graph showing the resistance curve of a magnetoresistive effect device as comparative sample #1.
Figure 11:
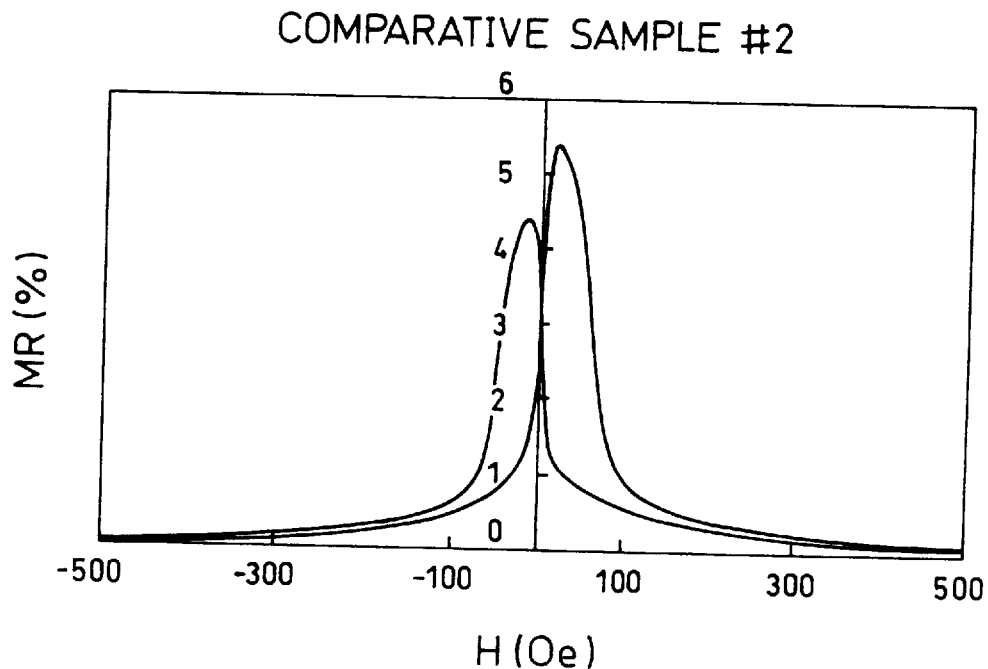
FIG. 11 is a graph showing the resistance curve of a magnetoresistive effect device as comparative sample #2.
Figure 12:
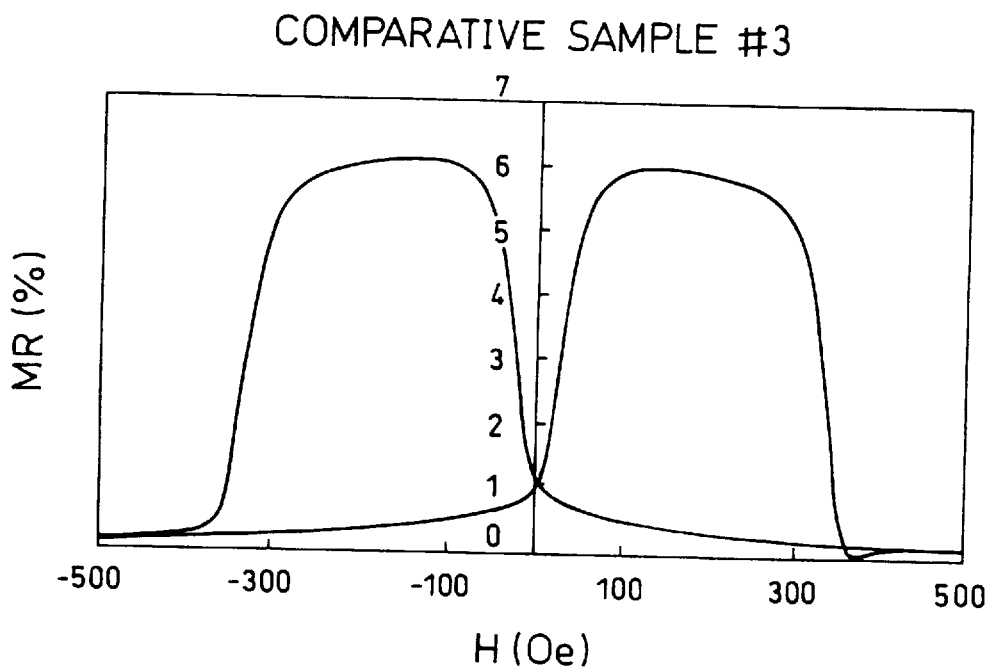
FIG. 12 is a graph showing the resistance curve of a magnetoresistive effect device as comparative sample #3.
Figure 13:
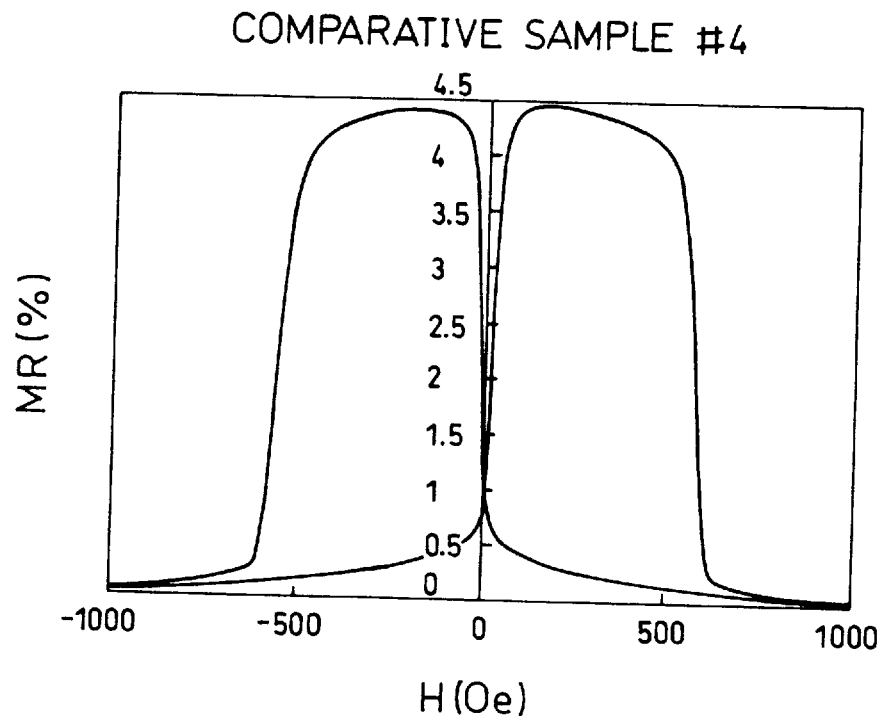
FIG. 13 is a graph showing the resistance curve of a magnetoresistive effect device as comparative sample #4.

FIG. 9 shows the resistance curve of sample #1 at room temperature. The resistance curve is the dependence of the resistance change (MR) on the external magnetic field (H). A preferred resistance curve shows such characteristics that the resistance is abruptly increased when the magnetic field is near zero and the maximum resistance value is retained until the largest possible magnetic field. Such characteristics mean that the magnetoresistive effect device has good magnetic sensitivity, a high saturation field, and is extremely stable with respect to the external magnetic field.

Table 1 shows the results of the measurements of the MR ratio (%), the sensitivity of resistance change (relative value), and the saturation field (A/m (Oe)) of sample #1 according to FIG. 9. In Table 1, the characteristics of comparative samples #1 to #4 formed by the same material with different layer structures are also shown for comparison purposes. In Table 1, the sensitivity of resistance change is given by a relative value by indicating the sensitivity of comparative sample #4 as 1. The resistance curves at room temperature of comparative samples #1 to #4 are shown in FIGS. 10 to 13, respectively.

In comparative sample #1, Fe was used as the buffer layer of Co as the free magnetization layer in a Co/Cu/Co sandwich film. Moreover, the coercive force was increased by subjecting Co as the pinned magnetization layer to natural oxidation.

In comparative sample #2, in order to increase the sensitivity, NiFe showing excellent soft magnetic properties was used instead of Fe in the structure of comparative sample #1.

In comparative sample #3, in order to increase the saturation field, a Co oxide film made of a ferromagnetic material having a high coercive force was used instead of the natural oxide film in the structure of comparative sample #2. The Co oxide film of the ferromagnetic material was used to fix the magnetization of the pinned magnetization layer. The Co oxide film of the ferromagnetic material was formed at such a partial pressure of oxygen that maximizes the coercive force of the Co oxide film shown in FIG. 3.

In comparative sample #4, a Co oxide film made of a ferromagnetic material similar to the Co oxide film used for comparative sample #3 was used instead of the nonmagnetic Co oxide film in the structure of comparative sample #1.

TABLE 1

| Sample No. | Film structure | MR ratio (%) | Sensitivity (relative value) | Saturation field (A/m(Oe)) |
|---|---|---|---|---|
| Sample #1 | Nonmagnetic Co oxide film/Co/Cu/NiFe | 4.7 | 2.15 | 76000 (955) |
| Comparative sample #1 | Fe/Co/Cu/Co/ natural oxide film | 10.9 | 1.38 | 23900 (300) |
| Comparative sample #2 | NiFe/Co/Cu/Co/ natural oxide film | 5.4 | 3.00 | 6400 (80) |
| Comparative sample #3 | NiFe/Co/Cu/Co/ ferro-magnetic Co oxide film | 6.1 | 0.77 | 28300 (356) |
| Comparative sample #4 | Ferromagnetic Co oxide film/ Co/Cu/NiFe | 4.5 | 1.00 | 48100 (604) |

The following is a review of FIGS. 9 to 13 and the results shown in Table 1.

With regard to comparative sample #1, the lower Co (free magnetization layer) is caused to have soft magnetic properties and a lower coercive force by Fe. On the other hand, the coercive force of the upper Co (pinned magnetization layer) is increased by the natural oxide film. It is therefore possible to obtain a high MR ratio of around 10% by comparative sample #1. However, comparative sample #1 is not stable with respect to the external magnetic field. This is understood from the result that the saturation field of this sample is around 23900 A/m (300 Oe). Moreover, the sensitivity of comparative sample #1 is not so good.

With regard to comparative sample #2, NiFe is used to decrease the coercive force of the lower Co (free magnetization layer). In comparative sample #2, although the sensitivity is increased, the saturation field of the pinned magnetization layer is extremely small. When the saturation field of the pinned magnetization layer is low like this sample, the characteristics as the magnetoresistive effect device become unstable. It is thus difficult to apply such a magnetoresistive effect device to magnetic apparatuses like magnetic heads and magnetic sensors.

With regard to comparative samples #3 and #4, Co is actively oxidized by reactive sputtering so as to increase the coercive force of Co as the pinned magnetization layer. In such a structure, it is possible to obtain a higher MR ratio and a higher saturation field compared to comparative sample #2 using the natural oxide film. It is also possible to obtain a higher MR ratio and a higher saturation field compared to a magnetoresistive effect device using a high coercive force film made of Co—Pt instead of the ferromagnetic Co oxide film.

However, in the structures of samples #3 and #4, although the saturation field is increased, the sensitivity is decreased, and these values are not sufficient for practical use. The reason for this is that the free magnetization layer and the pinned magnetization layer are magneto-statically coupled, and the rotation of magnetization of the free magnetization layer does not soft-magnetically occur. Namely, the magnetization of the free magnetization layer is influenced by the magnetization of the pinned magnetization layer, and is not readily switched.

On the other hand, although sample #1 has a slightly lower MR ratio of 4.7%, the magnetic sensitivity thereof is at least twice higher than comparative sample #4. Moreover, the saturation field of sample #1 is as large as 76000 A/m (955 Oe) which is more than 1.5 times larger than that of comparative sample #4. It is understood by comparing the curves shown in FIGS. 9 and 13 that the saturation field of the pinned magnetization layer 4 is increased by the use of the nonmagnetic Co oxide film for fixing the magnetization of the pinned magnetization layer 4 like sample #1. It is also understood from the gradient of the curves in the vicinity of the zero magnetic field of these figures that sample #1 using the nonmagnetic Co oxide film has a higher sensitivity than comparative sample #4. Namely, by using the nonmagnetic Co oxide film to fix the magnetization of the pinned magnetization layer 4, both of the sensitivity of resistance change of the sandwich film and the saturation field of the pinned magnetization layer 4 are increased.

As described above, the magnetoresistive effect device of this embodiment is constructed by layering the nonmagnetic oxide layer 5, pinned magnetization layer 4, nonmagnetic layer 3, and free magnetization layer 2 in this order on the substrate 1.

In this structure, when an external magnetic field is applied, the magnetization direction of the free magnetization layer 2 is determined. When the magnetization direction of the free magnetization layer 2 and that of the pinned magnetization layer 4 are antiparallel and have a 180° opposite state, the magnetoresistive effect device has a maximum resistance. On the other hand, when the magnetization directions of the two layers 2 and 4 are the same, namely parallel, the magnetoresistive effect device has a minimum resistance.

In this structure, when the coercive force of the pinned magnetization layer 4 is high, the difference between the coercive force of the magnetic layer 2 and that of the magnetic layer 4 increases, thereby providing a magnetoresistive effect device having stable characteristics.

Moreover, by providing the nonmagnetic oxide layer 5, the coercive force of the multilayer film formed by the nonmagnetic oxide layer 5 and the pinned magnetization layer 4 is increased to values not lower than 20000 A/m (250 Oe) at room temperature. It is thus possible to increase the saturation field of the pinned magnetization layer 4 and provide a magnetoresistive effect device which is stable with respect to the external magnetic field. In addition, since the nonmagnetic oxide layer 5 is nonmagnetic, Ms·t of the pinned magnetization layer 4 is lowered, and the magnetostatic coupling between the pinned magnetization layer 4 and the free magnetization layer 2 is weakened. As a result, the switching of the magnetization of the free magnetization layer 2 readily occurs, and the sensitivity of resistance change is improved.

Furthermore, since the giant magnetoresistive effect is produced at room temperature without providing a buffer layer made of a material with small specific resistivity like Fe and NiFe, it is possible to simplify the structure of the magnetoresistive effect device. Additionally, the nonmagnetic oxide layer 5 has a high specific resistivity in the order of $\Omega$cm. It is thus possible to obtain a high MR ratio without decreasing the overall resistance of the magnetoresistive effect device. With the use of the magnetoresistive effect device, it is possible to produce a magnetic head or magnetic sensor with high reproduction output.

When the nonmagnetic oxide layer 5 as a buffer layer is placed next to the free magnetization layer 2, i.e., the substrate/nonmagnetic oxide layer/free magnetization layer/ nonmagnetic layer/pinned magnetization layer are layered in this order, the MR ratio is improved, but a practical sensitivity value is not obtained. Thus, in order to increase the sensitivity, it is necessary to form the nonmagnetic oxide layer 5 and the pinned magnetization layer 4 next to each other like this embodiment.

Furthermore, by applying the magnetoresistive effect device to a magnetic head, it is possible to improve the information reading performance with respect to a high-density recorded magnetic recording medium.

FIG. 16(a) is a perspective view showing the schematic structure of a magnetic head 7 using the magnetoresistive effect device of this embodiment. The magnetic head 7 is used for performing reproduction in magnetic recording and reproducing apparatuses such as magnetic disk apparatuses and magnetic tape apparatuses. The magnetic head 7 moves relatively to a magnetic recording medium on which information is magnetically recorded, and detects the strength of a magnetic field received from the magnetic recording medium by the above-mentioned magnetoresistive effect. The magnetic head 7 has the magnetoresistive effect device of this embodiment at an edge thereof. Moreover, the magnetic head 7 includes signal leads 8, a conducting line L connected to the signal leads 8 and a constant current source P, which form conducting means for causing a current to flow in the magnetoresistive effect device. In addition, the magnetic head 7 includes a detector V which forms detecting means for detecting the electrical resistance of the device which changes according to the strength of the magnetic field of the magnetic recording medium. The detector V detects a change in the electrical resistance of the device in which a constant current is caused to flow through the signal leads 8 and the conducting line L by the constant current source P as a voltage change, and outputs the change as a voltage signal. The magnetoresistive effect device is sandwiched between an upper shield layer 9 and a lower shield layer 10 through insulating layers (not shown).

Figure 16B:
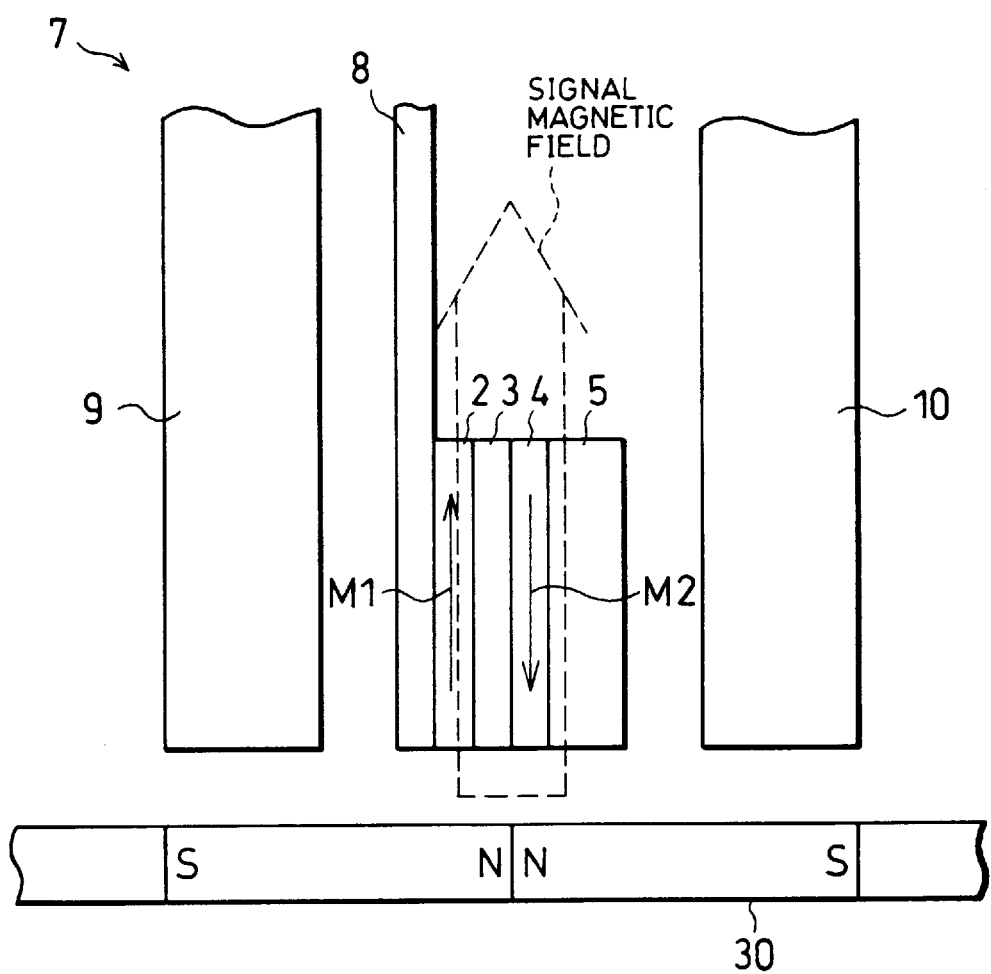
FIG. 16(b) is an explanatory view for explaining the reproducing operation of the magnetic head.

FIG. 16(b) is an explanatory view for explaining the magnetic head 7, and the reproduction operation of the magnetic head 7. As illustrated in FIG. 16(b), the magnetic head 7 is disposed in the close proximity of a magnetic recording medium 30, and a signal magnetic field (indicated by the dotted line) from the magnetic recording medium 30 acts on the magnetoresistive effect device. At this time, the direction of magnetization M1 of the free magnetization layer 2 of the magnetoresistive effect device rotates according to the signal magnetic field, and is oriented in a direction different from the direction of magnetization M2 of the pinned magnetization layer 4. As a result, the resistance of the magnetoresistive effect device changes. The change of the resistance varies the voltage to be detected by the detector V. Signals recorded on the magnetic recording medium 30 can be read out by measuring the voltage. N and S shown on the magnetic recording medium 30 represent the magnetic polarization of the signals recorded on the medium 30.

[Embodiment 2]

The following description will discuss Embodiment 2 of the present invention. The same members as those shown in the figures of the above-mentioned embodiment will be designated by the same code and their description will be omitted.

Figure 2:
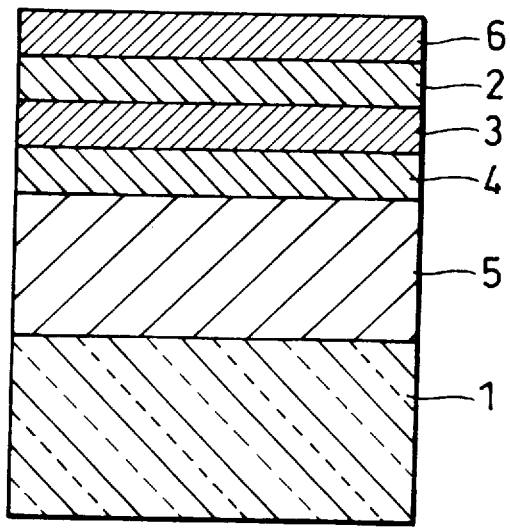
FIG. 2 is a cross sectional view showing the film structure of a magnetoresistive effect device according to Embodiment 2 of the present invention.

In addition to the structure described in Embodiment 1, a magnetoresistive effect device of this embodiment includes an antioxidant film 6 as a topmost layer. More specifically, as illustrated in FIG. 2, the magnetoresistive effect device is formed by layering the nonmagnetic oxide layer 5, pinned magnetization layer 4, nonmagnetic layer 3, free magnetization layer 2, and antioxidant film 6 in this order on the substrate 1.

The antioxidant film 6 is made of a nonmagnetic metal, and used for preventing the oxidation of the surface of the free magnetization layer 2. As the antioxidant film 6, it is possible to use nonmagnetic metals like Cu.

A sample of the above-mentioned magnetoresistive effect device will be described below.

Sample #2 was prepared by layering the nonmagnetic oxide layer 5 made of nonmagnetic Co oxide with a thickness of 200 Å, the pinned magnetization layer 4 made of Co with a thickness of 20 Å, the nonmagnetic layer 3 made of Cu with a thickness of 26 Å, the free magnetization layer 2 made of Co with a thickness of 20 Å, and the antioxidant film 6 made of Cu with a thickness of 20 Å on the substrate 1. The conditions for depositing the thin films of the respective layers are the same as those for Sample #1.

Figure 14:
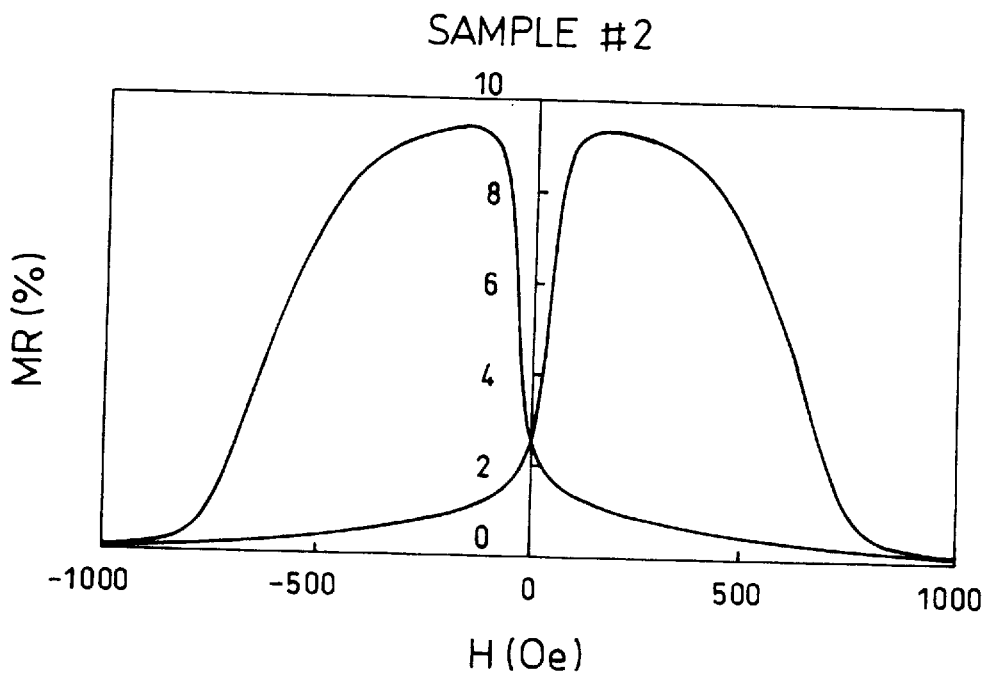
FIG. 14 is a graph showing the resistance curve of a magnetoresistive effect device as sample #2.
Figure 15:
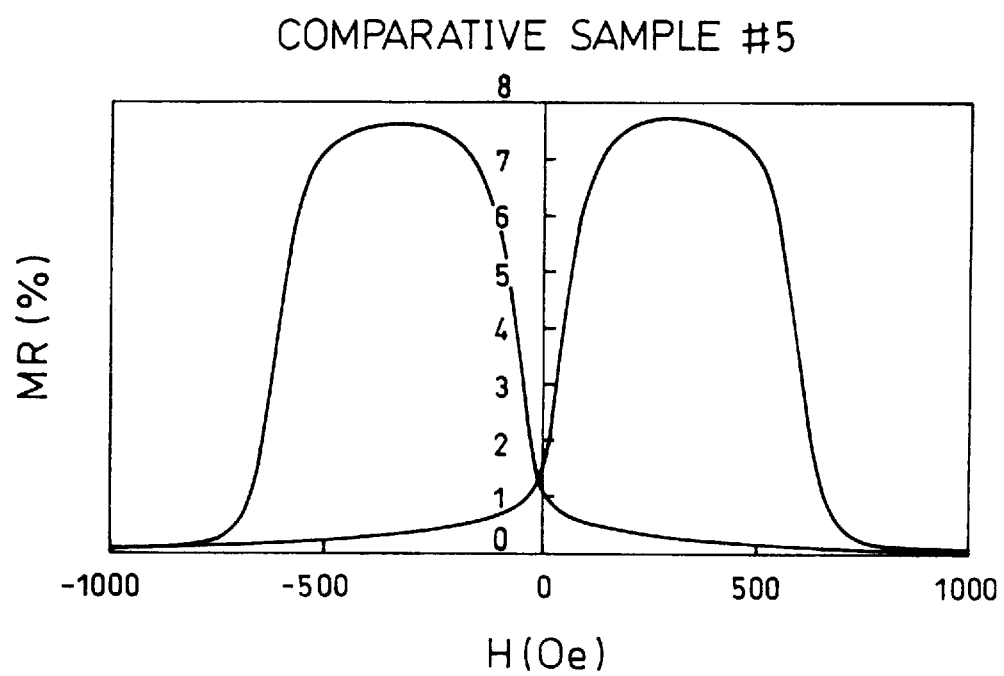
FIG. 15 is a graph showing the resistance curve of a magnetoresistive effect device as comparative sample #5.

FIG. 14 shows the resistance curve of sample #2 at room temperature. Table 2 shows the results of the measurements of the MR ratio (%), the sensitivity of resistance change (relative value), and the saturation field (A/m (Oe)) of sample #2 according to FIG. 14. In Table 2, the characteristics of comparative sample #5 formed by the same material with a different layer structure are also shown for comparison purposes. In Table 2, the sensitivity of resistance change is given by relative values by indicating the sensitivity of comparative sample #5 as 1. The resistance curve of comparative sample #5 at room temperature is shown in FIG. 15.

Comparative sample #5 uses the Co oxide film made of a ferromagnetic material with a high coercive force (same as that used for samples #3 and #4) instead of the nonmagnetic Co oxide film in the structure of sample #2 so as to fix the magnetization of the pinned magnetization layer.

As shown in Table 2, sample #2 gave better results than comparative sample #5 in respect of all of the MR ratio, the sensitivity, and the saturation field. Moreover, compared to sample #1 described in Embodiment 1, the MR ratio of sample #2 was significantly increased. With regard to the sensitivity, since NiFe has higher soft magnetic properties than Co, it is understood that the sensitivity of sample #1 is better than that of sample #2.

TABLE 2

| Sample No. | Film structure | MR ratio (%) | Sensitivity (relative value) | Saturation field (A/m(Oe)) |
| --- | --- | --- | --- | --- |
| Sample #2 | Nonmagnetic Co oxide film/Co/Cu/Co/Cu | 9.4 | 1.83 | 61500 (773) |
| Comparative sample #5 | Ferromagnetic Co oxide film/Co/Cu/Co/Cu | 7.7 | 1.00 | 53300 (670) |

As described above, similarly to the magnetoresistive effect device of Embodiment 1, the magnetoresistive effect device of this embodiment has the nonmagnetic oxide layer 5 in contact with the pinned magnetization layer 4. It is thus possible to obtain a high MR ratio at room temperature like the magnetoresistive effect device of Embodiment 1.

Moreover, in the magnetoresistive effect device of this embodiment, the magnetization of the pinned magnetization layer 4 is fixed by the nonmagnetic oxide layer 5, and the pinned magnetization layer 4 has a high coercive force. On the other hand, the coercive force of the free magnetization layer 2 which is protected from oxidation by the antioxidant film 6 is not increased. As a result, the difference between the coercive force of the pinned magnetization layer 4 and that of the free magnetization layer 2 is increased. It is thus possible to obtain a magnetoresistive effect device having more stable characteristics than the characteristics of the device of Embodiment 1.

In the structure of the magnetoresistive effect device of this embodiment, if the antioxidant layer 6 is not formed as the topmost layer, a natural oxide film is formed on the free magnetization layer 2, and the free magnetization layer 2 has a high coercive force. For example, when a magnetoresistive effect device was formed by layering a Cu(24.6 Å)/Co(43.5 Å) film on a glass substrate and by oxidizing Co with air, the coercive force of the magnetoresistive effect device was 2490.0 A/m (31.3 Oe). On the other hand, the coercive force of a magnetoresistive effect device formed by layering a Cu(24.6 Å)/Co(43.5 Å)/Cu(20 Å) film on a glass substrate was 915 A/m (11.5 Oe). Thus, when the coercive force of the free magnetization layer 2 is increased, the difference between the coercive force of the free magnetization layer 2 and that of the pinned magnetization layer 4 is decreased. It is therefore impossible to obtain a magnetoresistive effect device having stable magnetic characteristics.

In Embodiments 1 and 2, the Co oxide was used as the nonmagnetic oxide layer 5. However, it is not necessary to limit the nonmagnetic oxide layer 5 to the Co oxide. Namely, since Ni and Fe are ferromagnetic materials like Co, the oxides of these materials would have characteristics similar to those of the Co oxide.

In Embodiments 1 and 2, the sandwich films of the Co oxide film/Co/Cu/NiFe structure and the Co oxide film/Co/Cu/Co/Cu structure were used. In these structures, as the magnetostatic coupling between the pinned magnetization layer 4 and the free magnetization layer 2 is weakened, the sensitivity of the film is increased. Additionally, the coercive force of the pinned magnetization layer 4 is determined by the structure of the multilayer film formed by the nonmagnetic oxide layer 5 and the pinned magnetization layer 4, and the film deposition conditions. Thus, similar effects are obtained by the sandwich films of other structure. Namely, in order to fix the magnetization of the pinned magnetization layer 4, a film is formed by oxidizing the same material as that used for the pinned magnetization layer 4 until the material becomes nonmagnetic. Then, the film is layered next to the pinned magnetization layer 4 so that the multilayer film formed by this film and the pinned magnetization layer 4 has a coercive force of not lower than 20000 A/m (250 Oe) at room temperature. As a result, a sandwich film having a high sensitivity and saturation field is obtained.

Therefore, even if the sandwich film is used in the magnetic head or the magnetic sensor, a practical device can be produced.

Furthermore, although it is not necessary to use the same material for both of the nonmagnetic oxide layer 5 and the pinned magnetization layer 4, it is preferred to use the same material for a sputtering target. The reason for this is that when different materials are used for the formation of the layers 4 and 5, it is necessary to include sputtering targets made of the respective materials in the film depositing device. Namely, it is possible to reduce the cost by using the same material to form the layers 4 and 5.

Moreover, in Embodiments 1 and 2, the free magnetization layer is formed by Co or NiFe, and the pinned magnetization layer is formed by Co. Since these metals are easily obtainable, it is possible to produce magnetoresistive effect devices at low costs. In particular, when NiFe is used for the free magnetization layer, a magnetoresistive effect device with excellent sensitivity can be obtained because NiFe is softer in magnetic properties than Co.

In Embodiments 1 and 2, the nonmagnetic oxide layer 5 is formed on the substrate. However, it is possible to form a magnetoresistive effect device by layering the substrate/free magnetization layer/nonmagnetic layer/pinned magnetization layer/nonmagnetic antioxidant layer in this order. Namely, the magnetoresistive effect device of this embodiment has a high degree of freedom in terms of the structure. It is thus possible to reduce the structural limitations when applying the magnetoresistive effect device to a magnetic apparatus.

Furthermore, in the embodiments, a glass substrate or Si substrate is used as the substrate 1. However, needless to say, the same effect can be obtained by using substrates, such as alumina substrate, ceramic substrate, and ferrite substrate.

[Embodiment 3]

The following description will discuss Embodiment 3 of the present invention.

Figure 17:
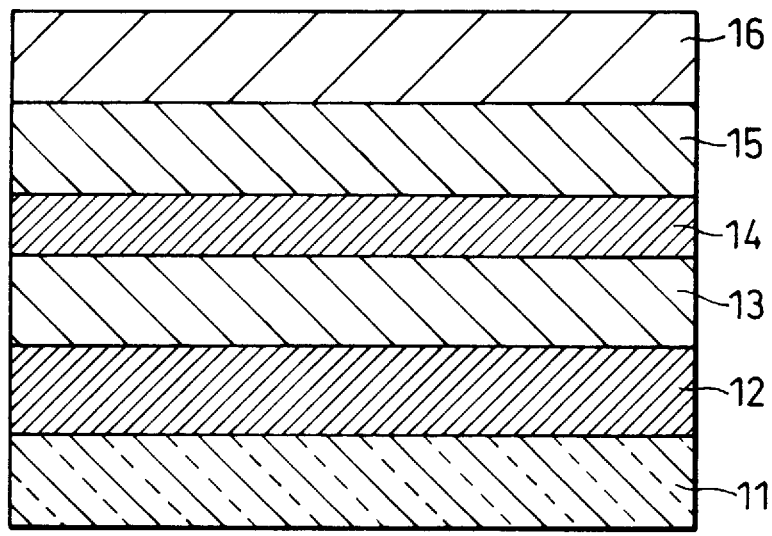
FIG. 17 is a cross sectional view showing a schematic structure of a sandwich type magnetoresistive effect film according to Embodiment 3 of the present invention.

FIG. 17 is a cross sectional view showing the structure of a magnetoresistive effect device of this embodiment. As shown in FIG. 17, in the magnetoresistive effect device, a Co oxide buffer layer 12 is formed on a substrate 11, and a magnetoresistive effect film (to be described later) is formed thereon. The magnetoresistive effect film is constructed by layering a free magnetization layer (first magnetic layer) 13, a nonmagnetic layer 14, a pinned magnetization layer (second magnetic layer) 15, and a high coercive force layer (high coercive force magnetic layer) 16 in this order.

The magnetization direction of the pinned magnetization layer 15 is fixed in the magnetization direction of the adjacent high coercive force layer 16. On the other hand, the magnetization direction of the free magnetization layer 13 freely rotates according to the external magnetic field. The magnetoresistive effect is produced by the angle between the magnetization direction of the pinned magnetization layer 15 and that of the free magnetization layer 13.

As the free magnetization layer 13, it is possible to use a Co layer, NiFe layer, composite layer of Co and NiFe, etc. As the nonmagnetic layer 14, it is possible to use a Cu layer, Au layer, Ag layer, Cr layer, etc. As the pinned magnetization layer 15, it is possible to use a Co layer, NiFe layer, etc.

The high coercive force layer 16 is provided for the purpose of increasing the coercive force of the adjacent pinned magnetization layer 15. As the material for the high coercive force magnetic layer 16, a Co oxide layer having a high coercive force, and a CoPt layer can be used. The Co oxide layer with a high coercive force is produced to satisfy such conditions that the oxygen composition in the Co oxide layer is smaller than the Co composition, the magnetization remains in the Co oxide layer, and the coercive force becomes a maximum.

The Co oxide buffer layer 12 is provided for the purpose of decreasing the interlayer coupling between the free magnetization layer 13 and the pinned magnetization layer 15. It is preferred that the Co oxide buffer layer 12 is formed by a nonmagnetic Co oxide layer. It was confirmed from the results of experiments to be described later that even if the Co oxide buffer layer 12 is magnetic, the structure including the Co oxide buffer layer 12 achieves an enhanced magnetoresistive effect compared to a structure having no Co oxide buffer layer 12.

The composition of the Co oxide buffer layer 12 was arranged to satisfy a condition for making the Co oxide layer to be nonmagnetic (the Co oxide layer may have slight magnetization), and the specific resistivity in the order of mΩcm. The condition means the deposition of the Co oxide buffer layer 12 by increasing the oxygen composition compared to that of the above-mentioned Co oxide layer with high coercive force. It was confirmed from the results of experiments (to be described later) that a preferred thickness of the layer 12 is not greater than 200 Å.

The Co oxide buffer layer 12 can be deposited by reactive RF magnetron sputtering with the use of Co as a sputtering target and a mixed gas of oxygen and argon as a sputtering gas. In this case, the composition ratio of Co to oxygen can be controlled by changing the concentration of oxygen in the mixed gas. In the case of the Co oxide buffer layer 12 of this embodiment, the layer 12 is formed to satisfy a condition for making the Co oxide layer nonmagnetic (the Co oxide layer may have slight magnetic properties).

The free magnetization layer 13 and the pinned magnetization layer 15 can be deposited by RF magnetron sputtering using an argon gas. The nonmagnetic layer 14 can be deposited by DC magnetron sputtering using an argon gas.

The following description will explain the results of experiments which were carried out to find suitable conditions for producing the Co oxide buffer layer 12. The conditions means the conditions for producing the Co oxide buffer layer 12 which can weaken the interlayer coupling between the free magnetization layer 13 and the pinned magnetization layer 15.

In these experiments, samples #11 to #16 of magnetoresistive effect devices were produced by changing the oxygen concentration (%) in forming the Co oxide buffer layer 12 and changing the thickness of the layer 12. Then, the MR ratio (%) was measured with respect to these magnetoresistive effect devices.

In the experiments, a Co/Cu/Co sandwich film with a high coercive force layer was produced by using a Co layer for the free magnetization layer 13 and the pinned magnetization layer 15, and a Cu layer for the nonmagnetic layer 14. At this time, the oxygen concentration in the mixed gas as one of the conditions for forming the Co oxide buffer layer 12 was changed within a range of 0.5 to 1.0% for the purpose of finding the difference in the magnetoresistive effect produced by the change in the concentration of oxygen. Moreover, the thickness of the Co oxide buffer layer 12 as one of the conditions for forming the Co oxide buffer layer 12 was changed within a range from 50 to 200 Å for the purpose of finding the difference in the magnetoresistive effect produced by the change in the thickness of the layer 12.

The steps of preparing samples #11 to #16 will be explained below.

In all of samples #11 to #16, a 0211 glass substrate available from Corning Inc. was used as the substrate 11. The Co oxide buffer layer 12 was deposited on the glass substrate by reactive RF magnetron sputtering by controlling the total gas pressure of the mixed gas to be 5 mTorr. At this time, the deposition rate was within a range of 0.7 to 1.0 Å/sec, and the degree of vacuum was not higher than $2 \times 10^{-7}$ Torr. With regard to sample #11, a mixed gas with an oxygen concentration of 0.5% was used, and the layer thickness was made 100 Å. With regard to sample #12, a mixed gas with the same oxygen concentration as sample #11 was used, and the layer thickness was made 200 Å. With regard to sample #13, a mixed gas with an oxygen concentration of 0.8% was used, and the layer thickness was made 100 Å. With regard to samples #14 to #16, a mixed gas with an oxygen concentration of 1.0% was used, and the layer thickness was changed to 50 Å, 100 Å, and 200 Å, respectively.

The following steps are common to samples #11 to #16. A Co layer with a thickness of 50 Å as the free magnetization layer 13, a Cu layer with a thickness of 26 Å as the nonmagnetic layer 14, and a Co layer with a thickness of 50 Å as the pinned magnetization layer 15 were layered in this order on the Co oxide buffer layer 12 without breaking vacuum.

The deposition of the Co layers as the free magnetization layer 13 and the pinned magnetization layer 15 was performed by RF magnetron sputtering by controlling the gas pressure of argon gas to be 5 mTorr. At this time, the deposition rate was within a range of 0.3 to 0.7 Å/sec. In this case, since the Co target used for forming the Co oxide layer 12 was also used for the formation of the free magnetization layer 13 and the pinned magnetization layer 15, the production cost was reduced. The deposition of the Cu layer as the nonmagnetic layer 14 was performed by DC magnetron sputtering by controlling the gas pressure of argon gas to be 5 mTorr. At this time, the deposition rate was within a range of 0.3 to 0.7 Å/sec.

Finally, the Co oxide layer with a high coercive force and a thickness of 200 Å was deposited as the high coercive force layer 16 by reactive RF magnetron sputtering. The deposition of the Co oxide layer was performed by using a mixed gas with an oxygen concentration of 0.95% at a total gas pressure of 3 mTorr.

Consequently, the Co/Cu/Co sandwich film with the high coercive force layer was obtained. The deposition rate of the Co oxide layer with a high coercive force was within a range of 0.7 to 1.0 Å/sec. The coercive force of the 200 Å thick high coercive force Co oxide layer formed under the above-mentioned conditions was 33000 A/m (415 Oe).

Table 3 shows the results of the measurements of the MR ratio (%) of samples #11 to #16. In Table 3, the results of the measurements of comparative sample #11 having no Co oxide layer are also shown for comparative purposes. Comparative sample #11 was formed by layering a Co layer (50 Å) as the free magnetization layer, a Cu layer (26 Å) as the nonmagnetic layer, and a Co layer (50 Å) as the pinned magnetization layer in this order directly on the 0211 glass substrate available from Corning Inc., which was the same substrate as that used for samples #11 to #16, and by further layering a 200 Å thick Co oxide layer with a high coercive force as the high coercive force layer. All of the measurements shown in Table 3 were carried out at room temperature.

The following is the review of the results shown in Table 3.

1) The MR ratio of comparative sample #11 having no Co oxide buffer layer was 0.25%. It is therefore understood that there is no substantial change in the resistance in the sandwich film having no Co oxide buffer layer. In this case, the coercive force of the pinned magnetization layer is increased by placing the high coercive force Co oxide layer next to the pinned magnetization layer so as to produce a difference in the coercive force of the pinned magnetization layer and that of the free magnetization layer. However, no magnetoresistive effect was obtained. The reason for this would be that a strong coupling between the magnetization of the pinned magnetization layer and the magnetization of the free magnetization layer occurs in the structure having no Co oxide buffer layer, as reported in document (4) mentioned above.

On the other hand, in samples #11 to #16, it is considered that the crystal orientation or the layer interface changes due to the nonmagnetic Co oxide buffer layer 12. It is considered that the change of the interface weakens the coupling between the magnetization of the pinned magnetization layer 15 and the magnetization of the free magnetization layer 13, and a large magnetoresistive effect is obtained.

TABLE 3

(Relationship between the MR ratio and conditions for forming Co oxide buffer layer)

| Sample No. | Total gas pressure (mTorr) | oxygen concentration (%) | Thickness of buffer layer (Å) | MR ratio (%) |
| --- | --- | --- | --- | --- |
| #11 | 5 | 0.5 | 100 | 5.10 |
| #12 | 5 | 0.5 | 200 | 3.87 |
| #13 | 5 | 0.8 | 100 | 7.69 |
| #14 | 5 | 1.0 | 50 | 7.87 |
| #15 | 5 | 1.0 | 100 | 6.72 |
| #16 | 5 | 1.0 | 200 | 3.68 |
| Comparative sample #11 | — | — | Nil | 0.25 |

2) Even when the thickness of the Co oxide layer 12 is as thick as 200 Å, an enhanced effect is produced compared to a structure having no buffer layer. However, it is understood by comparing the results of measuring samples #11 and #12, and samples #14 to #16 that the smaller the thickness of the Co oxide buffer layer 12, the higher the MR ratio. In addition, when the Co oxide buffer layer 12 is thin, the entire film thickness of the magnetoresistive effect device using the magnetoresistive effect film is reduced. Consequently, the production of the device becomes easier, and the overall resistance of the film is increased. Considering these advantages, it can be said that a preferred thickness of the Co oxide buffer layer 12 is not more than 200 Å.

3) Samples #11 and #13 have the same layer thickness. However, the MR ratio of sample #11 produced by the mixed gas with an oxygen concentration of 0.5% is smaller than the MR ratio of sample #13. The reason for this would be that, in the conditions for forming the Co oxide buffer layer 12, the degree of oxidation caused by the oxygen concentration of 0.5% is slightly insufficient, and therefore the magnetization remains on the Co oxide buffer layer 12. Then, a single layer film of Co oxide was formed under the same conditions as for the Co oxide buffer layer 12 of sample #11, and the magnetization thereof was measured. As a result, it was confirmed that a magnetization of about 130 emu/cc remained. Moreover, a two-layer film of Co oxide buffer layer/Co was formed under the same conditions as for the Co oxide buffer layer 12 and the adjacent free magnetization layer 13 of sample #11, and the magnetization thereof was measured. As a result, it was understood that the coercive force of the Co layer of the two-layer film was increased to 10000 A/m (130 Oe).

On the other hand, it was confirmed from the results of the magnetization measurements that the Co oxide buffer layer 12 of sample #13 was nonmagnetic. In the free magnetization layer 13 adjacent to such a nonmagnetic Co oxide buffer layer 12, the magnetic properties could hardly deteriorate. Thus, a large magnetoresistive effect was produced by sample #13.

Considering this fact, it can be said that the sputtering conditions for forming the perfectly nonmagnetic Co oxide buffer layer 12 need to be set so that the oxygen concentration in the mixed gas is not lower than 0.8% when the total gas pressure is 5 mTorr. It is also understood that, although the Co oxide buffer layer 12 is preferably nonmagnetic, it may have slight magnetic properties.

As described above, in the magnetoresistive effect device of this embodiment, first, the Co oxide buffer layer 12 is formed on the substrate 11. Then, a magnetoresistive effect film is formed on the Co oxide buffer layer 12. The magnetoresistive effect film is formed by layering the Co oxide buffer layer 12, the free magnetization layer (first magnetic layer) 13, the nonmagnetic layer 14, the pinned magnetization layer (second magnetic layer) 15, and the high coercive force layer 16 in this order. The specific resistivity of the Co oxide buffer layer 12 is in the order of mΩcm. By forming such a Co oxide buffer layer 12 as the buffer layer of the free magnetization layer 13, the interlayer coupling between the pinned magnetization layer 15 and the free magnetization layer 13 can be weakened. It is therefore possible to increase the MR ratio without causing little lowering of the overall resistance of the magnetoresistive effect film.

In this case, although the Co oxide buffer layer 12 is preferably nonmagnetic, it may have slight magnetization. It is possible to obtain the nonmagnetic Co oxide buffer layer 12 by reactive RF magnetron sputtering by controlling the total gas pressure to be 5 mTorr and the concentration of oxygen in the mixed gas of argon and oxygen not to be less than 0.8%.

Japanese Publication for Unexamined Patent Application No. 66033/1995 (Tokukaihei 7-66033) discloses a sandwich film including two magnetic layers formed as buffer layers or cap layers by an antiferromagnetic material CoO, and a nonmagnetic layer sandwiched between the two magnetic layers. It is also disclosed that the magnetoresistive effect can be improved by fixing the magnetization of the adjacent magnetic layers in this structure.

However, CoO used in this structure is an antiferromagnetic material, and used for the purpose of fixing the magnetization of an adjacent oxide layer. Namely, it is impossible to provide CoO as the buffer layer of the free magnetization layer, and use the CoO for the purpose of weakening the coupling between the two magnetic layers (the pinned magnetization layer and the free magnetization layer).

Figure 18:
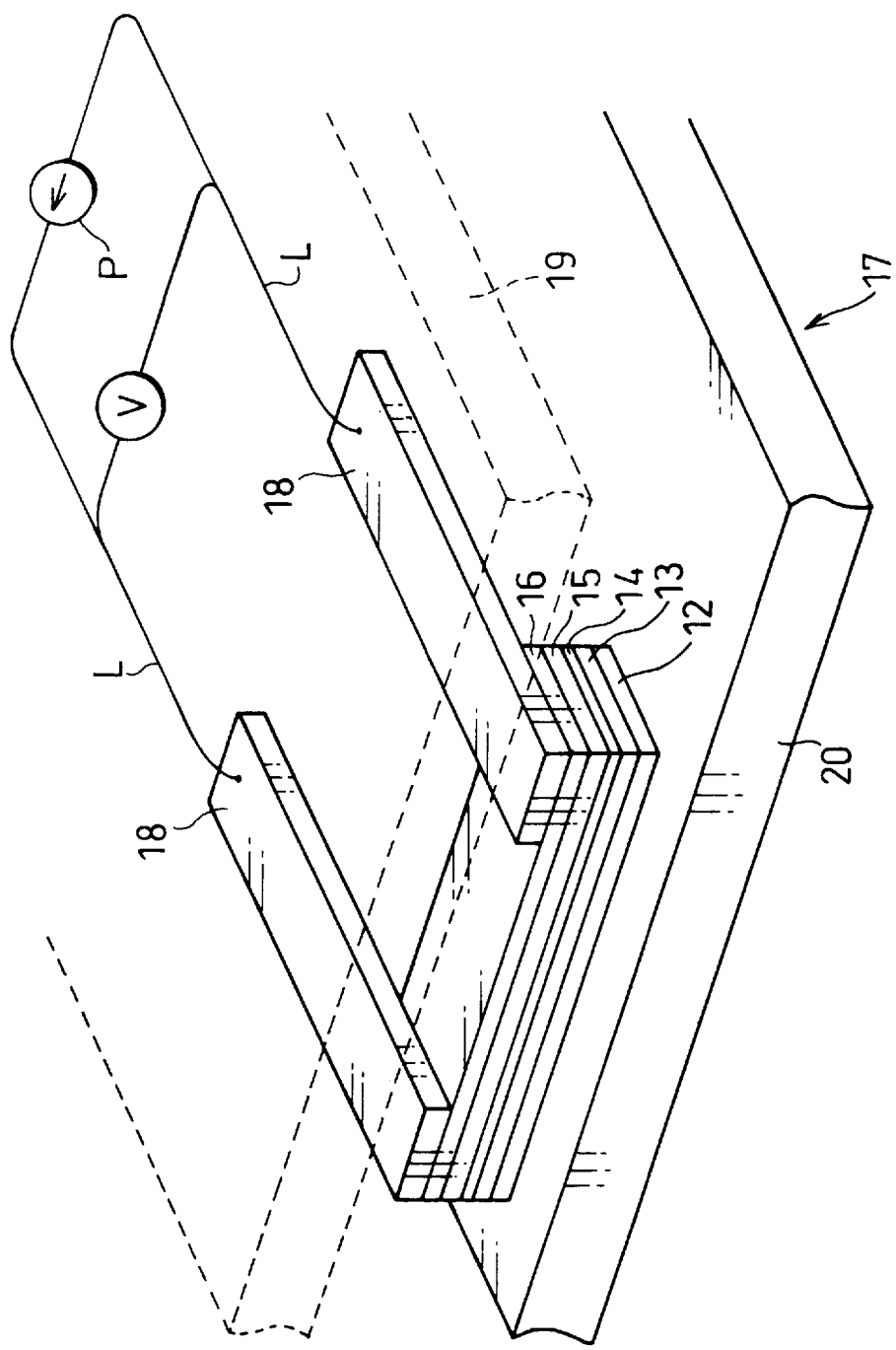
FIG. 18(a) is a perspective view showing the structure of a magnetic head including a magnetoresistive effect device using the sandwich type magnetoresistive effect film shown in FIG. 17.
FIG. 18(b) is an explanatory view for explaining the reproducing operation of the magnetic head.
Figure 18:
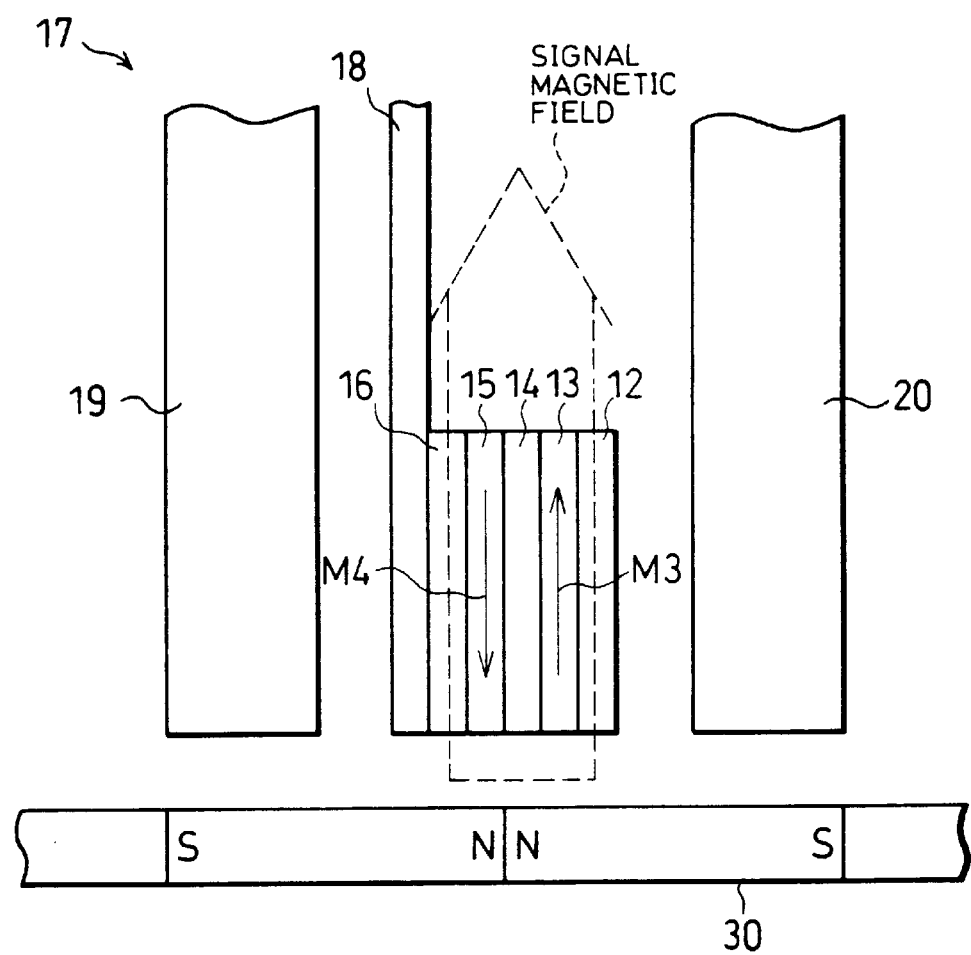

Moreover, by applying the magnetoresistive effect device of this embodiment to a magnetic head, it is possible to improve the performance of reading information recorded on a magnetic recording medium at high density. FIG. 18(a) is a perspective view showing the schematic structure of a magnetic head 17 using the magnetoresistive effect device of this embodiment. The magnetic head 17 is used for reproduction in magnetic recording and reproducing apparatuses such as magnetic disk apparatuses and magnetic tape apparatuses. The magnetic head 17 moves relatively to the magnetic recording medium on which information is magnetically recorded, and detects the strength of a magnetic field received from the magnetic recording medium by the above-mentioned magnetoresistive effect. The magnetic head 17 includes the magnetoresistive effect device of this embodiment at an edge thereof. The magnetic head 17 also includes signal leads 18, the conducting line L and constant current source P, which form conducting means for causing a current to flow in the magnetoresistive effect device. In addition, the magnetic head 17 includes the detector V which forms detecting means for detecting the electrical resistance of the device which changes according to the strength of the magnetic field of the magnetic recording medium. The detecting means V detects a change in the electrical resistance of the device in which a constant current is caused to flow through the conducting line L and signal leads 18 by the constant current source P as a voltage change, and outputs the change as a voltage signal. The magnetoresistive effect device is sandwiched between an upper shield layer 19 and a lower shield layer 20 through insulating layers (not shown). FIG. 18(b) is an explanatory view for explaining the magnetic head 17, and the reproduction operation of the magnetic head 17. As illustrated in FIG. 18(b), the magnetic head 17 is disposed in the close proximity of the magnetic recording medium 30, and a signal magnetic field (indicated by the dotted line) from the magnetic recording medium 30 acts on the magnetoresistive effect device. At this time, the direction of magnetization M3 of the free magnetization layer 13 of the magnetoresistive effect device rotates according to the signal magnetic field, and is oriented in a direction different from the direction of magnetization M4 of the pinned magnetization layer 15. As a result, the resistance of the magnetoresistive effect device changes. The change of the resistance varies the voltage to be detected by the detecting means V. Signals recorded on the magnetic recording medium 30 can be read out by measuring the voltage. N and S shown on the magnetic recording medium 30 represent the magnetic polarization of the signals recorded on the medium 30.

[Embodiment 4]

The following description will discuss Embodiment 4 of the present invention.

Figure 19:
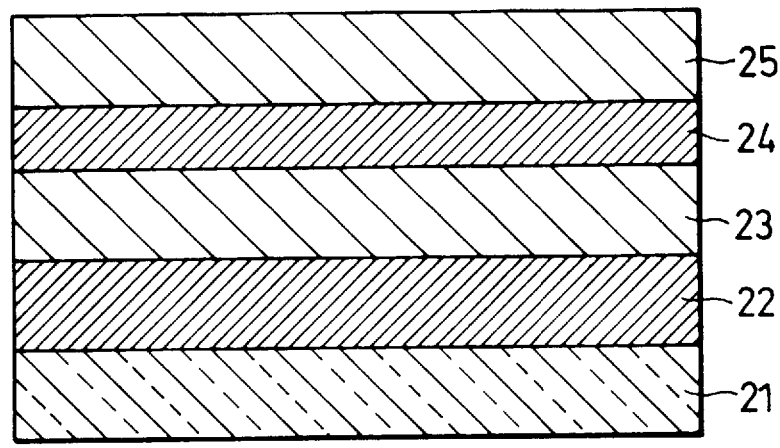
FIG. 19 is a cross sectional view showing a schematic structure of a sandwich type magnetoresistive effect film according to Embodiment 4 of the present invention.
Figure 20:
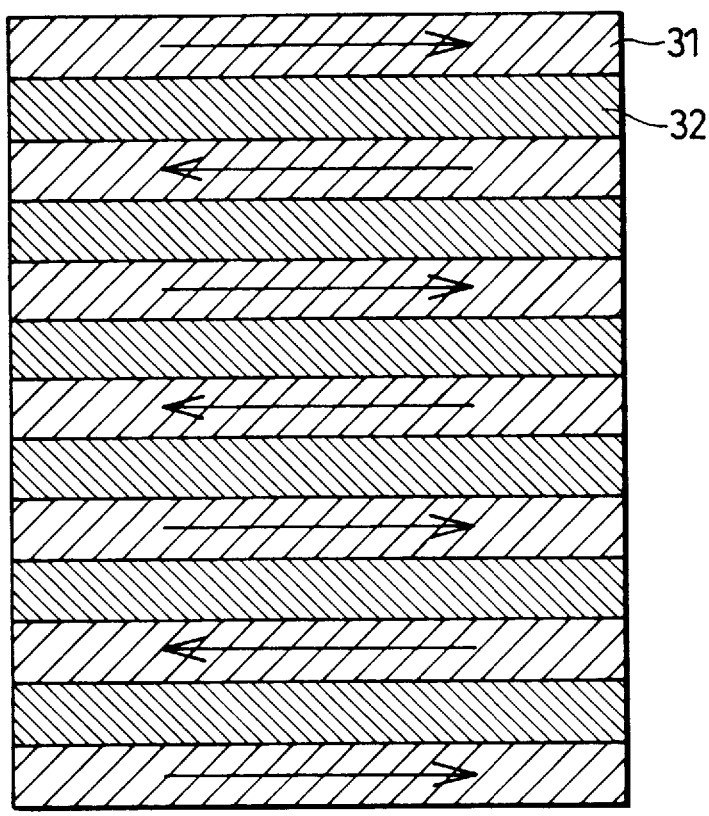
FIG. 20 is a cross sectional view showing a schematic structure of a conventional multilayer type magnetoresistive effect film.
Figure 21:
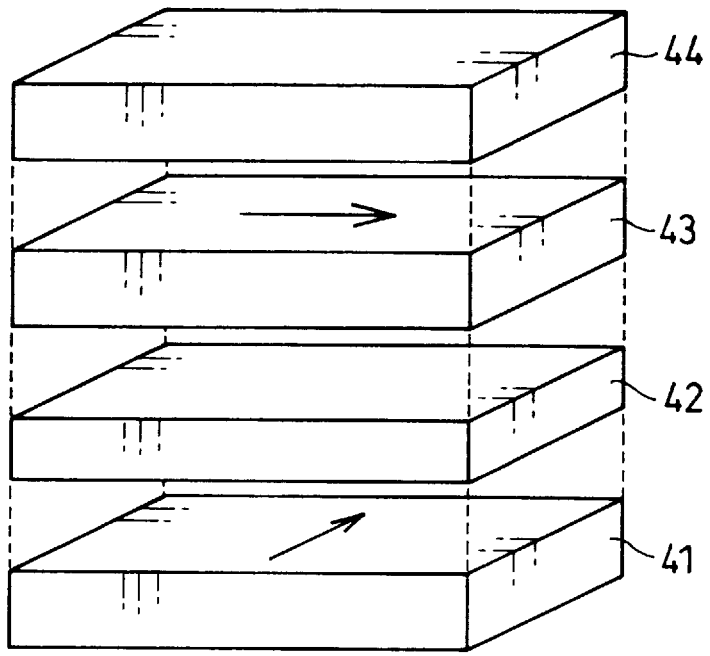
FIG. 21 is an exploded perspective view showing a schematic structure of a conventional spin-valve type magnetoresistive effect film.
Figure 22:
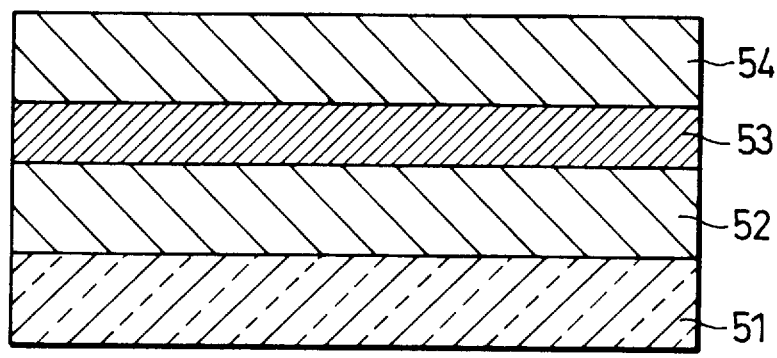
FIG. 22 is a cross sectional view showing a schematic structure of a conventional sandwich type magnetoresistive effect film.

FIG. 19 is a cross sectional view showing the structure of a magnetoresistive effect device of this embodiment. As illustrated in FIG. 19, in the magnetoresistive effect device, first, a Co oxide buffer layer 22 is formed on a substrate 21. Then, a magnetoresistive effect film is formed on the Co oxide buffer layer 22. The magnetoresistive effect film is formed by layering a free magnetization layer (first magnetic layer) 23, a nonmagnetic layer 24, and a pinned magnetization layer (second magnetic layer) 25 made of a Co layer in this order. With regard to the pinned magnetization layer 25, only the surface thereof is exposed to the atmosphere and oxidized by air (natural oxidation).

The magnetization direction of the pinned magnetization layer 25 is fixed in the magnetization direction of the surface layer oxidized by air. On the other hand, the magnetization direction of the free magnetization layer 23 freely rotates according to an external magnetic field. In this magnetoresistive effect device, the magnetoresistive effect is produced by the angle between the magnetization directions of the pinned magnetization layer 25 and the free magnetization layer 23.

As the free magnetization layer 23, it is possible to use a Co layer, NiFe layer, composite layer of Co and NiFe, etc. As the nonmagnetic layer 24, it is possible to use a Cu layer, Au layer, Ag layer, Cr layer, etc. As the pinned magnetization layer 25, the Co layer is used as mentioned above.

Similarly to the Co oxide buffer layer 12 of Embodiment 3, the Co oxide buffer layer 22 is used so as to weaken the interlayer coupling between the free magnetization layer 23 and the pinned magnetization layer 25. It is preferred that the Co oxide buffer layer 22 is formed by a nonmagnetic Co oxide layer. It was confirmed that even if the Co oxide buffer layer 22 has slight magnetization, the structure including the Co oxide buffer layer 22 achieves a greater magnetoresistive effect compared to a structure having no Co oxide buffer layer 22. Like the Co oxide buffer layer 12, the composition of the Co oxide buffer layer 22 was formed to satisfy the condition for making the Co oxide buffer layer 22 nonmagnetic (the Co oxide buffer layer 22 may have slight magnetization), and the specific resistivity in the order of mΩcm. Moreover, a preferred thickness of the layer 22 is not greater than 200 Å.

The Co oxide buffer layer 22, the free magnetization layer 23, and the pinned magnetization layer 25 are obtained in the same manner as the Co oxide buffer layer 12, the free magnetization layer 13, and the pinned magnetization layer 15, respectively, of Embodiment 3.

Sample #17 of the magnetoresistive effect device of this embodiment and comparative sample #12 were produced, and the MR ratio (%) was measured at room temperature on the respective samples. The results of the measurements will be presented below. This experiment was performed to confirm the improvement of the magnetoresistive effect. Comparative sample #12 was produced based on the structure of sample #17, without including the Co oxide buffer layer 22.

In this experiment, a Co/Cu/Co sandwich film was produced by using a Co layer for both of the pinned magnetization layer 25 and the free magnetization layer 23, and a Cu layer for the nonmagnetic layer 24.

In sample #17, the 0211 glass substrate available from Corning Inc. was used as the substrate 21. The 100 Å thick nonmagnetic Co oxide buffer layer 22 was deposited on the glass substrate 21 by reactive RF magnetron sputtering. For the deposition of the Co oxide buffer layer 22, a mixed gas with an oxygen concentration of 1.0% was used, and the total gas pressure was controlled to be 5 mTorr. At this time, the deposition rate was within a range of 0.7 to 1.0 Å/sec, and the degree of vacuum was not higher than $2 \times 10^{-7}$ Torr.

Thereafter, a Co layer with a thickness of 50 Å as the free magnetization layer 23, a Cu layer with a thickness of 26 Å as the nonmagnetic layer 24, and a Co layer with a thickness of 50 Å as the pinned magnetization layer 25 were layered in this order on the Co oxide buffer layer 22 without breaking vacuum.

The deposition of the Co layers as the free magnetization layer 23 and the pinned magnetization layer 25 was performed by RF magnetron sputtering by controlling the gas pressure of argon gas to be 5 mTorr. At this time, the deposition rate was within a range of 0.3 to 0.7 Å/sec.

The deposition of the Cu layer as the nonmagnetic layer 24 was performed by DC magnetron sputtering by controlling the gas pressure of argon gas to be 5 mTorr. At this time, the deposition rate was within a range of 0.3 to 0.7 Å/sec. Thereafter, the film was exposed to the atmosphere, and only the Co layer on the surface of the pinned magnetization layer 25 was oxidized by air. The MR ratio of sample #17 thus formed was 2.18%.

Meanwhile, comparative sample #12 was produced in the same manner as sample #17, with an exception that the step of forming a Co oxide buffer layer on the glass substrate is not included. Comparative sample #12 was formed by layering a free magnetization layer made of a Co layer (50 Å), a nonmagnetic layer made of a Cu layer (26 Å), and a pinned magnetization layer made of a Co layer (50 Å) in this order directly on a glass substrate, and oxidizing the surface of the pinned magnetization layer by air. The MR ratio of comparative sample #12 was 0.15%. Namely, a change in the resistance could hardly occurred in comparative sample #12 having no Co oxide buffer layer.

Thus, it is possible to increase the MR ratio with the sandwich film in which a high coercive force layer is not formed next to the pinned magnetization layer. The increase in the MR ratio is achieved by the use of the Co oxide buffer layer as the buffer layer of the free magnetization layer.

Moreover, similarly to the magnetoresistive effect device of Embodiment 3, by applying the magnetoresistive effect device of this embodiment to the magnetic head 17 shown in FIG. 18(a), it is possible to improve the performance of reading information recorded on a magnetic recording medium at high density. The magnetic head 17 is used for reproduction in magnetic recording and reproducing apparatuses such as magnetic disk apparatuses and magnetic tape apparatuses.

In Embodiments 3 and 4 above, as the magnetoresistive effect film formed on the Co oxide buffer layers (12, 22), the Co/Cu/Co sandwich film with a surface oxidized by air, and the Co/Cu/Co sandwich film with a high coercive force Co oxide layer were used respectively. However, the present invention is not limited to these structures. For example, even in a spin-valve film having an antiferromagnetic layer like FeMn as explained in the section of the background of the invention, the MR ratio can be increased by providing the nonmagnetic Co oxide layer (that may have slight magnetic properties) as the buffer layer of the free magnetization layer.

Moreover, in Embodiments 3 and 4 above, samples including the magnetic layers 13 and 15 formed by Co were described. However, the present invention is not necessarily limited to these structures. However, it is preferred to form the magnetic layers 13 and 15 by Co. The reason for this is that when the magnetic layers 13 and 15 are formed by materials other than Co, it is necessary to include a sputtering target other than Co in the film depositing device. Namely, the use of Co for both of the layers 13 and 15 can reduce the cost.

Furthermore, it is described that the pinned magnetization layer 13 and the free magnetization layer 15 are formed by a Co layer, NiFe layer, or multilayer thereof. It is also described that the nonmagnetic layer 14 is formed by Cu, Au, Ag, or Cr. It is further described that the high coercive force film layer 16 is formed by Co oxide, or CoPt. Since these metals are easily obtainable, it is possible to produce magnetoresistive effect devices at low costs.

As described above, the nonmagnetic oxide layer 5 of Embodiments 1 and 2 has a specific resistivity in the order of some Ωcm, while the Co oxide buffer layers 12 and 22 of Embodiments 3 and 4 have a specific resistivity in the order of mΩcm. The reason for such a big difference in the values of resistance between the nonmagnetic oxide layer 5 and the Co oxide buffer layers 12 and 22 is that the specific resistivity of the Co oxide varies very sensitively according to the partial pressure of oxygen during the deposition of the film. For example, when the pressure of the mixed gas of argon and oxygen during the film deposition is 3 mTorr, the specific resistivity of the resultant Co oxide film reaches a maximum value of 7 Ωcm with an oxygen concentration of 1.3%. In the vicinity of this oxygen concentration, the resistivity lowers to a level in a range of some hundred $\mu$Ωcm to some mΩcm. The specific resistivity of normal metallic Co is some $\mu$Ωcm. Therefore, the specific resistivity of Co shows a 6-digit scale change.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A magnetoresistive effect device comprising:

a magnetoresistive effect film including a first magnetic layer whose magnetization direction rotates according to an external magnetic field, a nonmagnetic layer formed next to said first magnetic layer, and a second magnetic layer whose magnetization direction is fixed in one direction, said second magnetic layer being placed next to said nonmagnetic layer, said magnetoresistive effect film having a magnetoresistive effect produced by an angle between the magnetization directions of said first and second magnetic layers; and a nonmagnetic oxide layer adjacent to said second magnetic layer of said magnetoresistive effect film.

2. The magnetoresistive effect device according to claim 1, wherein said nonmagnetic oxide layer is formed by oxidizing a material used for said second magnetic layer.

3. The magnetoresistive effect device according to claim 1, wherein said nonmagnetic oxide layer, second magnetic layer, nonmagnetic layer, and first magnetic layer are layered in this order on a substrate.

4. The magnetoresistive effect device according to claim 1, wherein an antioxidant film for preventing oxidation of said first magnetic layer is formed on said first magnetic layer.

5. The magnetoresistive effect device according to claim 1, wherein said second magnetic layer is made of Co.

6. The magnetoresistive effect device according to claim 1, wherein said first magnetic layer is made of Co or NiFe.

7. The magnetoresistive effect device according to claim 1, wherein said nonmagnetic oxide layer is made of a nonmagnetic Co oxide.

8. The magnetoresistive effect device according to claim 1, wherein said nonmagnetic oxide layer has an oxygen composition between a first oxygen composition in which oxide is made nonmagnetic by increasing an oxygen composition and a second oxygen composition which is just before an oxygen composition in which the oxygen composition is further increased from the first oxygen composition so that a coercive force of a multilayer film formed by said nonmagnetic oxide layer and said second magnetic layer converges to a substantially constant value.

9. The magnetoresistive effect device according to claim 1, wherein a coercive force of a multilayer film formed by layering said nonmagnetic oxide layer and said second magnetic layer is not smaller than 20000 A/m (250 Oe).

10. The magnetoresistive effect device according to claim 1, wherein an antioxidant film made of a nonmagnetic metal for preventing oxidation of said first magnetic layer is formed on said first magnetic layer.

11. The magnetoresistive effect device according to claim 1, wherein said nonmagnetic oxide layer, second magnetic layer, nonmagnetic layer, and first magnetic layer are formed on a substrate made of either glass, Si, alumina, ceramic, or ferrite.

12. The magnetoresistive effect device according to claim 1, wherein said nonmagnetic oxide layer is made of an oxide of Ni or Fe.

13. The magnetoresistive effect device according to claim 1, wherein said nonmagnetic oxide layer is made of an oxide which is nonmagnetic at room temperature.

14. The magnetoresistive effect device according to claim 1, wherein said nonmagnetic oxide layer is an oxide of a ferromagnetic material, and nonmagnetic at room temperature.

15. A magnetic head comprising:
a magnetoresistive effect device defined in claim 1;
conducting means for causing a current to flow in said magnetoresistive effect device; and
detecting means for detecting an electrical resistance of said magnetoresistive effect device, which changes according to a strength of a magnetic field corresponding to magnetic information recorded on a magnetic recording medium.

16. A magnetoresistive effect device comprising:
a magnetoresistive effect film including a first magnetic layer whose magnetization direction rotates according to an external magnetic field, a nonmagnetic layer adjacent to said first magnetic layer, and a second magnetic layer whose magnetization direction is fixed in one direction, said second magnetic layer being placed next to said nonmagnetic layer, said magnetoresistive effect film having a magnetoresistive effect produced by an angle between the magnetization directions of said first and second magnetic layers; and
a Co oxide layer as a buffer layer of said first magnetic layer of said magnetoresistive effect film.

17. The magnetoresistive effect device according to claim 16, further comprising a high coercive force magnetic layer adjacent to said second magnetic layer.

18. The magnetoresistive effect device according to claim 16, wherein said magnetoresistive effect film has a three-layer structure in which said Co oxide layer as the buffer layer is formed on a substrate, and said first magnetic layer, nonmagnetic layer and second magnetic layer are formed in this order on said Co oxide layer.

19. The magnetoresistive effect device according to claim 16, wherein said magnetoresistive effect film has a four-layer structure in which said Co oxide layer as the buffer layer is formed on a substrate, and said first magnetic layer, nonmagnetic layer, second magnetic layer and a high coercive force magnetic layer are formed in this order on said Co oxide layer.

20. The magnetoresistive effect device according to claim 16, wherein said Co oxide layer is nonmagnetic.

21. The magnetoresistive effect device according to claim 16, wherein said Co oxide layer has a thickness of not grater than 200 Å.

22. The magnetoresistive effect device according to claim 16, wherein said Co oxide layer has a specific resistivity in the order of mΩcm.

23. The magnetoresistive effect device according to claim 16, wherein said first magnetic layer is made of at least one of Co and NiFe.

24. The magnetoresistive effect device according to claim 16, wherein said second magnetic layer is made of at least one of Co and NiFe.

25. The magnetoresistive effect device according to claim 16, wherein said nonmagnetic layer is made of one of Cu, Au, Ag and Cr.

26. The magnetoresistive effect device according to claim 16, further comprising a high coercive force magnetic layer made of Co oxide or CoPt next to said second magnetic layer.

27. A magnetic head comprising:
a magnetoresistive effect device defined in claim 16;
conducting means for causing a current to flow in said magnetoresistive effect device; and
detecting means for detecting an electrical resistance of said magnetoresistive effect device, which changes according to a strength of a magnetic field corresponding to magnetic information recorded on a magnetic recording medium.

* * * * *